US 11,367,973 B2

(12) United States Patent
Oosaka et al.

(10) Patent No.: US 11,367,973 B2
(45) Date of Patent: Jun. 21, 2022

(54) BOARD-TO-BOARD CONNECTOR

(71) Applicant: Japan Aviation Electronics Industry, Ltd., Tokyo (JP)

(72) Inventors: Junji Oosaka, Tokyo (JP); Yuichi Takenaga, Tokyo (JP); Akihiro Matsunaga, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 0 days.

(21) Appl. No.: 17/184,838

(22) Filed: Feb. 25, 2021

(65) Prior Publication Data
US 2021/0305733 A1 Sep. 30, 2021

(30) Foreign Application Priority Data

Mar. 27, 2020 (JP) .............................. JP2020-058408

(51) Int. Cl.
*H01R 12/00* (2006.01)
*H01R 12/71* (2011.01)
(Continued)

(52) U.S. Cl.
CPC ......... *H01R 12/714* (2013.01); *H01R 12/707* (2013.01); *H01R 12/7052* (2013.01);
(Continued)

(58) Field of Classification Search
CPC .... H01R 12/714; H01R 43/205; H01R 13/50; H01R 12/707; H01R 13/2442;
(Continued)

(56) References Cited

U.S. PATENT DOCUMENTS 4,758,927 A * 7/1988 Berg ..................... H05K 3/325
29/827
6,241,545 B1 * 6/2001 Bricaud ............... G06K 7/0021
439/326

(Continued)

FOREIGN PATENT DOCUMENTS

JP H06267621 A 9/1994
JP 2006-156023 A 6/2006
(Continued)

OTHER PUBLICATIONS

Japanese Office Action corresponding application No. JP2020-058408 dated Apr. 13, 2021, and English translation.
(Continued)

*Primary Examiner* — Abdullah A Riyami
*Assistant Examiner* — Nelson R. Burgos-Guntin
(74) *Attorney, Agent, or Firm* — Renner, Otto, Boisselle & Sklar, LLP

(57) ABSTRACT

A connector includes a rectangular flat-plate housing including a first positioning hole and a second positioning hole, and a contact row and a contact row held on the housing. The housing includes a first pitch side surface and a second pitch side surface on an opposite side of the first pitch side surface. The contact row and the contact row extend from the first pitch side surface to the second pitch side surface. The first positioning hole is disposed between the first pitch side surface and the contact row, and the second positioning hole is disposed between the first pitch side surface and the contact row.

3 Claims, 20 Drawing Sheets

(51) Int. Cl.
  *H01R 12/70*    (2011.01)
  *H01R 13/50*    (2006.01)
  *H01R 13/41*    (2006.01)
  *H01R 43/20*    (2006.01)
  *H05K 1/18*     (2006.01)
  *H01R 13/24*    (2006.01)
  *H01R 12/57*    (2011.01)
  *H01R 13/621*   (2006.01)
  *H01R 13/631*   (2006.01)

(52) U.S. Cl.
  CPC ......... *H01R 13/2442* (2013.01); *H01R 13/41* (2013.01); *H01R 13/50* (2013.01); *H01R 43/205* (2013.01); *H05K 1/181* (2013.01); *H01R 12/57* (2013.01); *H01R 13/6215* (2013.01); *H01R 13/631* (2013.01); *H05K 2201/09063* (2013.01); *H05K 2201/09445* (2013.01); *H05K 2201/10189* (2013.01); *H05K 2201/2009* (2013.01)

(58) Field of Classification Search
  CPC .. H01R 13/41; H01R 12/7052; H01R 13/631; H01R 12/57; H01R 13/6215; H05K 1/181; H05K 2201/09445; H05K 2201/09063; H05K 2201/2009; H05K 2201/10189
  USPC ......................................................... 439/626
  See application file for complete search history.

(56) References Cited

U.S. PATENT DOCUMENTS

| | | | | |
|---|---|---|---|---|
| 6,368,138 | B1* | 4/2002 | Huang | H01R 43/0256 439/331 |
| 6,869,302 | B2* | 3/2005 | Bricaud | G06K 7/0021 439/326 |
| 9,886,985 | B1* | 2/2018 | Okamoto | G11B 33/027 |
| 2002/0057468 | A1* | 5/2002 | Segawa | H01L 27/14618 358/509 |
| 2008/0153360 | A1 | 6/2008 | Yuan et al. | |
| 2009/0135573 | A1* | 5/2009 | Sato | H05K 1/144 361/803 |
| 2013/0344742 | A1* | 12/2013 | Kuwahara | H01R 12/714 439/626 |
| 2016/0099512 | A1* | 4/2016 | Ohsawa | H01R 12/7076 439/66 |
| 2016/0187378 | A1* | 6/2016 | Nagata | G01R 1/0416 324/756.05 |
| 2016/0294090 | A1* | 10/2016 | Yang | H01R 12/58 |
| 2019/0356073 | A1* | 11/2019 | Kawakami | H01R 13/2435 |
| 2021/0119361 | A1* | 4/2021 | Perry | H05K 1/142 |
| 2021/0132140 | A1* | 5/2021 | Tsai | G01R 31/2863 |
| 2021/0167532 | A1* | 6/2021 | Ashibu | H01R 12/716 |

FOREIGN PATENT DOCUMENTS

| | | |
|---|---|---|
| JP | 2007-335231 A | 12/2007 |
| JP | 2010-182551 A | 8/2010 |
| JP | 2012014854 A | 1/2012 |
| JP | 2012-074264 A | 4/2012 |
| JP | 2014-017156 A | 1/2014 |
| JP | 2017-027671 A | 2/2017 |

OTHER PUBLICATIONS

Office Action dated Jan. 24, 2022 in corresponding U.S. Appl. No. 17/501,077.

Decision to Grant corresponding Japanese application (OEE application) No. JP2020-058408 dated May 18, 2021, and English translation.

Office Action dated Mar. 4, 2022 in corresponding U.S. Appl. No. 17/501,077.

* cited by examiner

BOARD-TO-BOARD CONNECTOR

INCORPORATION BY REFERENCE

This application is based upon and claims the benefit of priority from Japanese patent application No. 2020-058408, filed on Mar. 27, 2020, the disclosure of which is incorporated herein in its entirety by reference.

BACKGROUND

The present disclosure relates to a board-to-board connector.

Patent Literature 1 (Japanese Unexamined Patent Application Publication No. 2010-182551) discloses a connector 100 that is disposed between a first printed board having a plurality of electrodes and a second printed board having a plurality of electrodes, and electrically connects the plurality of electrodes of the first printed board with the plurality of electrodes of the second printed board respectively as shown in FIG. 20 of the present application.

The connector 100 includes an insulating plate 101 and a plurality of elastic conductors 102 that are held on the insulating plate 101. The insulating plate 101 has two positioning holes 103.

SUMMARY

The connector 100 disclosed in Patent Literature 1 has room for improvement in terms of size reduction.

An object of the present disclosure is to provide a technique to reduce the size of a board-to-board connector.

According to an aspect of the present invention, there is provided a board-to-board connector to be mounted on a first board and interposed between the first board and a second board to electrically connect a plurality of pads of the first board with a plurality of pads of the second board respectively, the board-to-board connector including a rectangular flat-plate housing including a first positioning hole and a second positioning hole, and a first contact row and a second contact row held on the housing, wherein the housing includes a first side surface on one side thereof and a second side surface on another side thereof opposite to the one side, the first contact row and the second contact row extend from the first side surface to the second side surface, the first positioning hole is disposed between the first side surface and the first contact row, and the second positioning hole is disposed between the first side surface and the second contact row.

According to the present disclosure, the size reduction of a board-to-board connector is achieved.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

A first embodiment is described hereinafter with reference to FIGS. 1 to 15.

Figure 1:
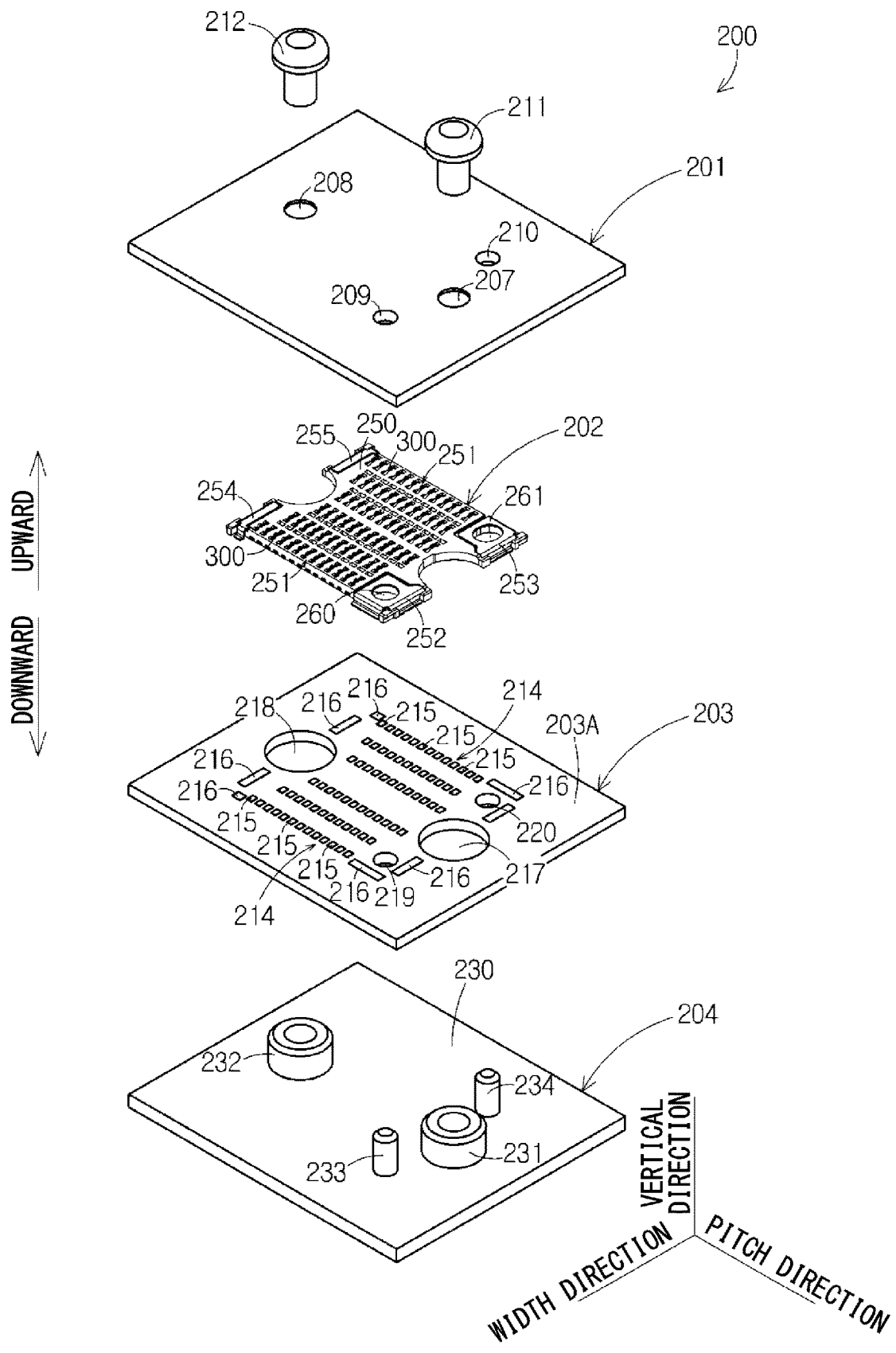
FIG. 1 is an exploded perspective view of an information processing device (first embodiment)
Figure 2:
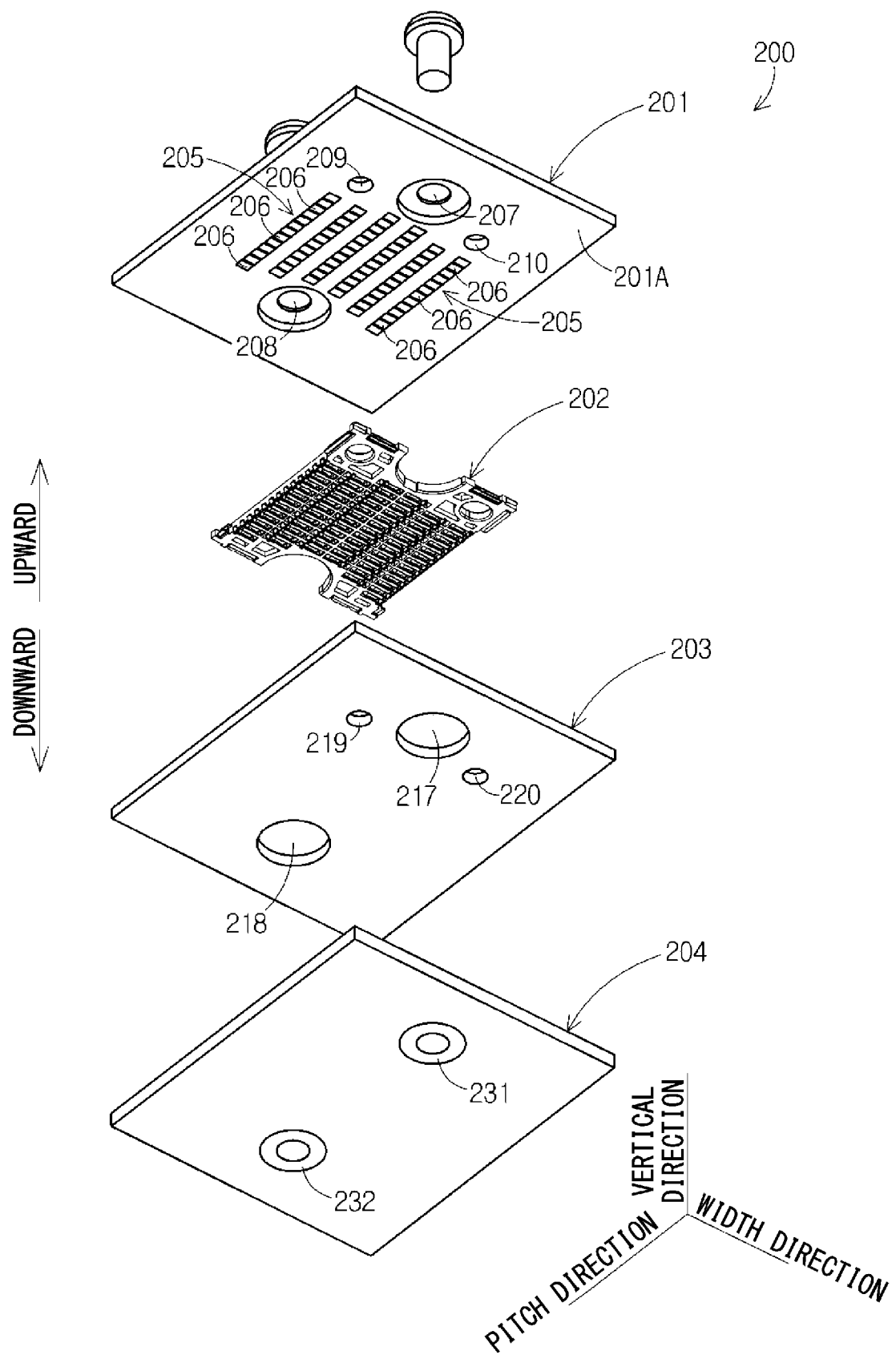
FIG. 2 is an exploded perspective view of the information processing device viewed from another angle (first embodiment)

FIGS. 1 and 2 are exploded perspective views of an information processing device 200. As shown in FIGS. 1 and 2, the information processing device 200 includes a CPU board 201, a connector 202, an input-output board 203, and a support board 204. The connector 202 is disposed between the CPU board 201 and the input-output board 203.

The CPU board 201 and the input-output board 203 are rigid boards such as a paper phenolic board or a glass epoxy board, for example.

As shown in FIG. 2, the CPU board 201 includes a connector opposed surface 201A to be opposed to the connector 202. A plurality of pad rows 205 are formed on the connector opposed surface 201A. In this embodiment, six pad rows 205 are formed. The plurality of pad rows 205 extend parallel to one another. The plurality of pad rows 205 are lined up in a direction orthogonal to a direction in which one of the pad rows 205 extends. Each of the pad rows 205 includes a plurality of pads 206.

The CPU board 201 has a first bolt fastening hole 207, a second bolt fastening hole 208, a first positioning hole 209, and a second positioning hole 210. The first bolt fastening hole 207 and the second bolt fastening hole 208 are formed in such a way that the plurality of pad rows 205 are located between the first bolt fastening hole 207 and the second bolt fastening hole 208 in the longitudinal direction of each pad row 205. The first positioning hole 209 and the second positioning hole 210 are formed to be adjacent to the first bolt fastening hole 207 in the direction orthogonal to the longitudinal direction of each pad row 205. The first positioning hole 209 and the second positioning hole 210 are formed in such a way that the first bolt fastening hole 207 is located between the first positioning hole 209 and the second positioning hole 210 in the direction orthogonal to the longitudinal direction of each pad row 205.

As shown in FIG. 1, the input-output board 203 includes a connector opposed surface 203A to be opposed to the connector 202. A plurality of pad rows 214 are formed on the connector opposed surface 203A. In this embodiment, six pad rows 214 are formed. The plurality of pad rows 214 extend parallel to one another. The plurality of pad rows 214 are lined up in a direction orthogonal to a direction in which one of the pad rows 214 extends. Each of the pad rows 214 includes a plurality of pads 215. Further, a plurality of pads 216 for hold-down are formed on the connector opposed surface 203A.

The input-output board 203 has a first bolt fastening hole 217, a second bolt fastening hole 218, a first penetrating hole 219, and a second penetrating hole 220. The first bolt fastening hole 217 and the second bolt fastening hole 218 are formed in such a way that the plurality of pad rows 214 are located between the first bolt fastening hole 217 and the second bolt fastening hole 218 in the longitudinal direction of each pad row 214. The first penetrating hole 219 and the second penetrating hole 220 are formed to be adjacent to the first bolt fastening hole 217 in the direction orthogonal to the longitudinal direction of each pad row 214. The first penetrating hole 219 and the second penetrating hole 220 are formed in such a way that the first bolt fastening hole 217 is located between the first penetrating hole 219 and the second penetrating hole 220 in the direction orthogonal to the longitudinal direction of each pad row 214.

The support board 204 is typically a part of a casing that accommodates the CPU board 201, the connector 202, and the input-output board 203, and it is made of aluminum or aluminum alloy, for example. The support board 204 includes a flat-plate board main body 230, a first nut 231, a second nut 232, a cylindrical first positioning pin 233, and a cylindrical second positioning pin 234.

The first nut 231 is disposed to correspond to the first bolt fastening hole 217 of the input-output board 203.

The second nut 232 is disposed to correspond to the second bolt fastening hole 218 of the input-output board 203.

The cylindrical first positioning pin 233 is disposed to correspond to the first penetrating hole 219 of the input-output board 203.

The cylindrical second positioning pin 234 is disposed to correspond to the second penetrating hole 220 of the input-output board 203.

Figure 3:
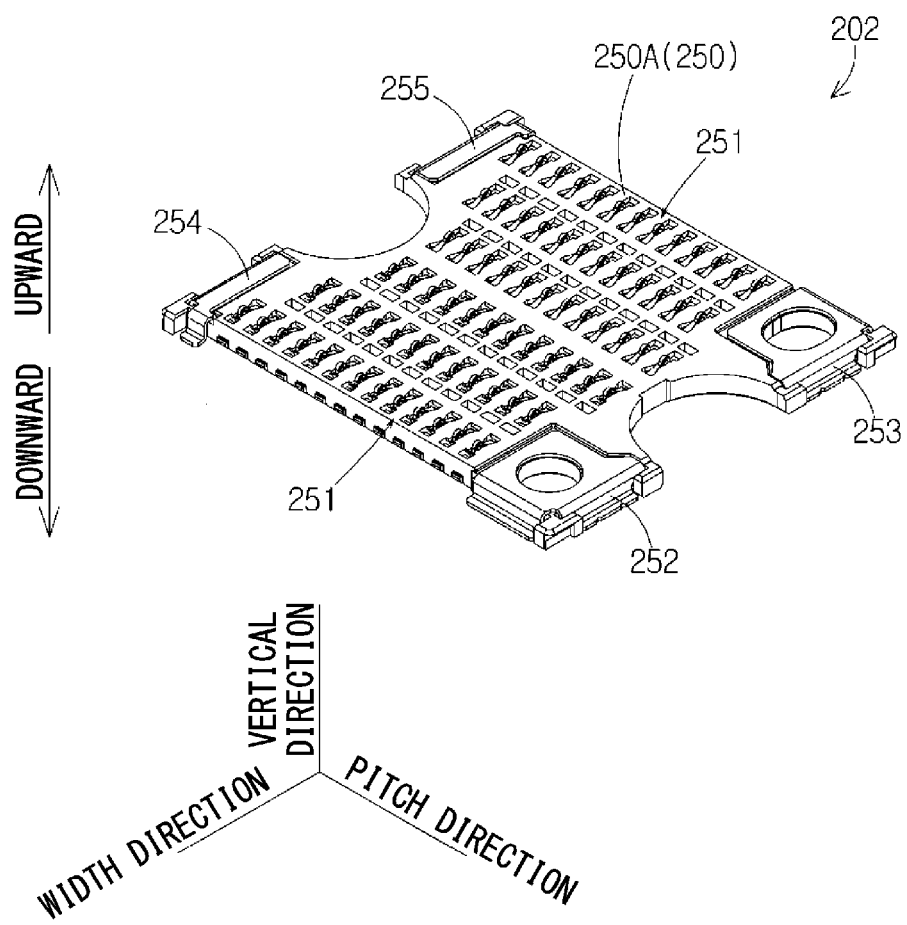
FIG. 3 is a perspective view of a connector (first embodiment)
Figure 4:
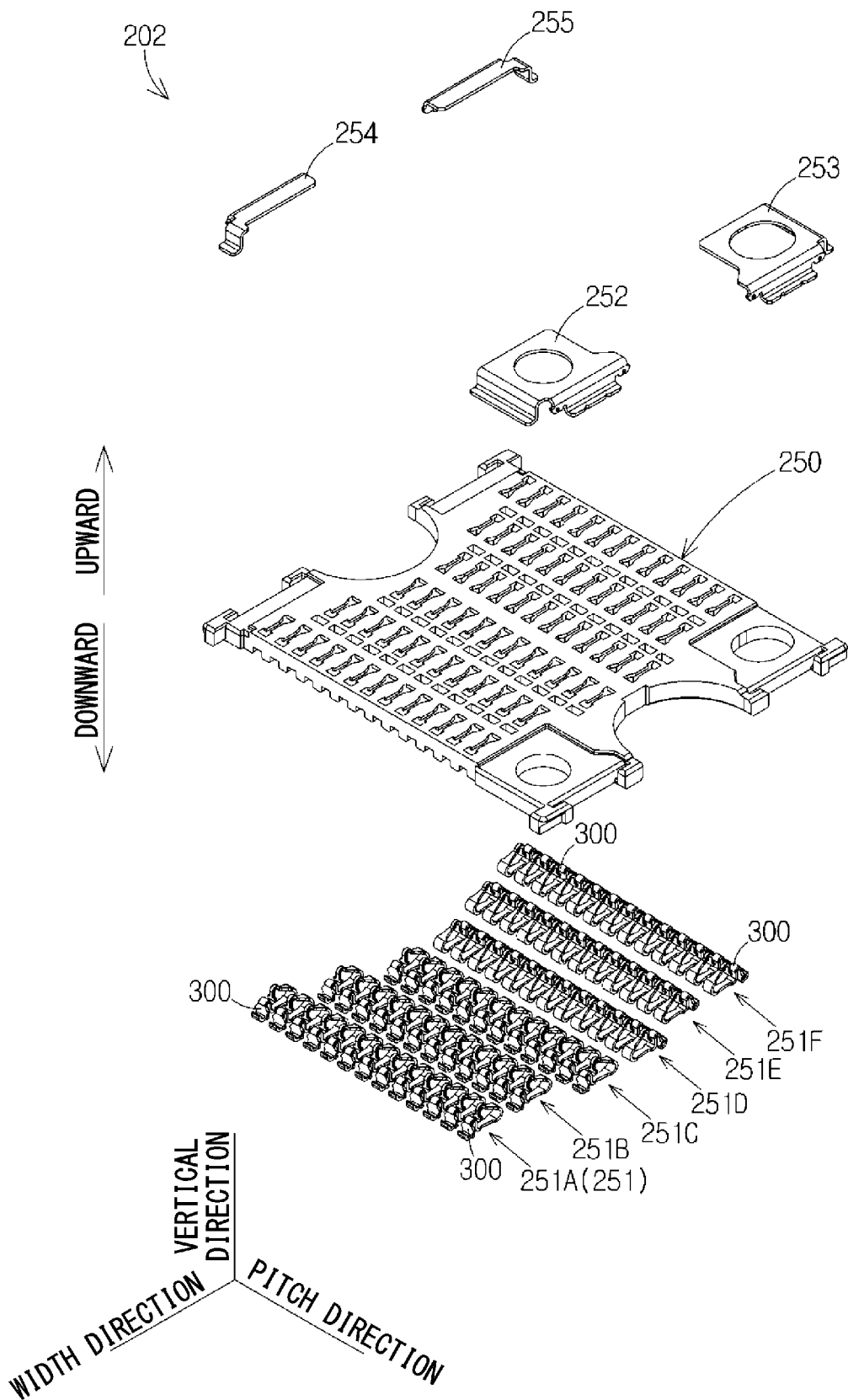
FIG. 4 is an exploded perspective view of the connector (first embodiment)

The connector 202 is surface-mountable by soldering on the connector opposed surface 203A of the input-output board 203. As shown in FIGS. 3 and 4, the connector 202 includes a rectangular flat-plate housing 250 made of insulating resin, a plurality of contact rows 251, a first hold-down 252, a second hold-down 253, a third hold-down 254, and a fourth hold-down 255. The plurality of contact rows 251, the first hold-down 252, the second hold-down 253, the third hold-down 254, and the fourth hold-down 255 are held on the housing 250.

As shown in FIGS. 3 and 4, the plurality of contact rows 251 extend parallel to one another. The plurality of contact rows 251 are lined up in a direction orthogonal to a direction in which one of the contact rows 251 extends. As shown in FIG. 4, the plurality of contact rows 251 include six contact rows 251. The six contact rows 251 include a contact row 251A, a contact row 251B, a contact row 251C, a contact row 251D, a contact row 251E, and a contact row 251F. Each contact row 251 includes a plurality of contacts 300 made of metal.

Each contact 300 is formed by punching and bending a metal plate formed by plating copper or copper alloy, for example. Likewise, the first hold-down 252, the second hold-down 253, the third hold-down 254, and the fourth hold-down 255 are formed by punching and bending a metal plate such as a stainless steel plate, for example.

The terms "vertical direction", "pitch direction" and "width direction" are defined by referring to FIG. 1 The vertical direction, the pitch direction and the width direction are directions that are orthogonal to one another.

As shown in FIG. 1, the vertical direction is the thickness direction of the housing 250. The vertical direction includes upward and downward. The upward direction is the direction of viewing the CPU board 201 from the housing 250. The downward direction is the direction of viewing the input-output board 203 from the housing 250. The vertical direction is the direction used by way of illustration only and should not be interpreted as limiting the posture of the connector 202 when it is actually used.

The pitch direction is the longitudinal direction of each contact row 251. The width direction is the direction orthogonal to the vertical direction and the pitch direction. The plurality of contact rows 251 are disposed to separate from each other in the width direction.

Figure 5:
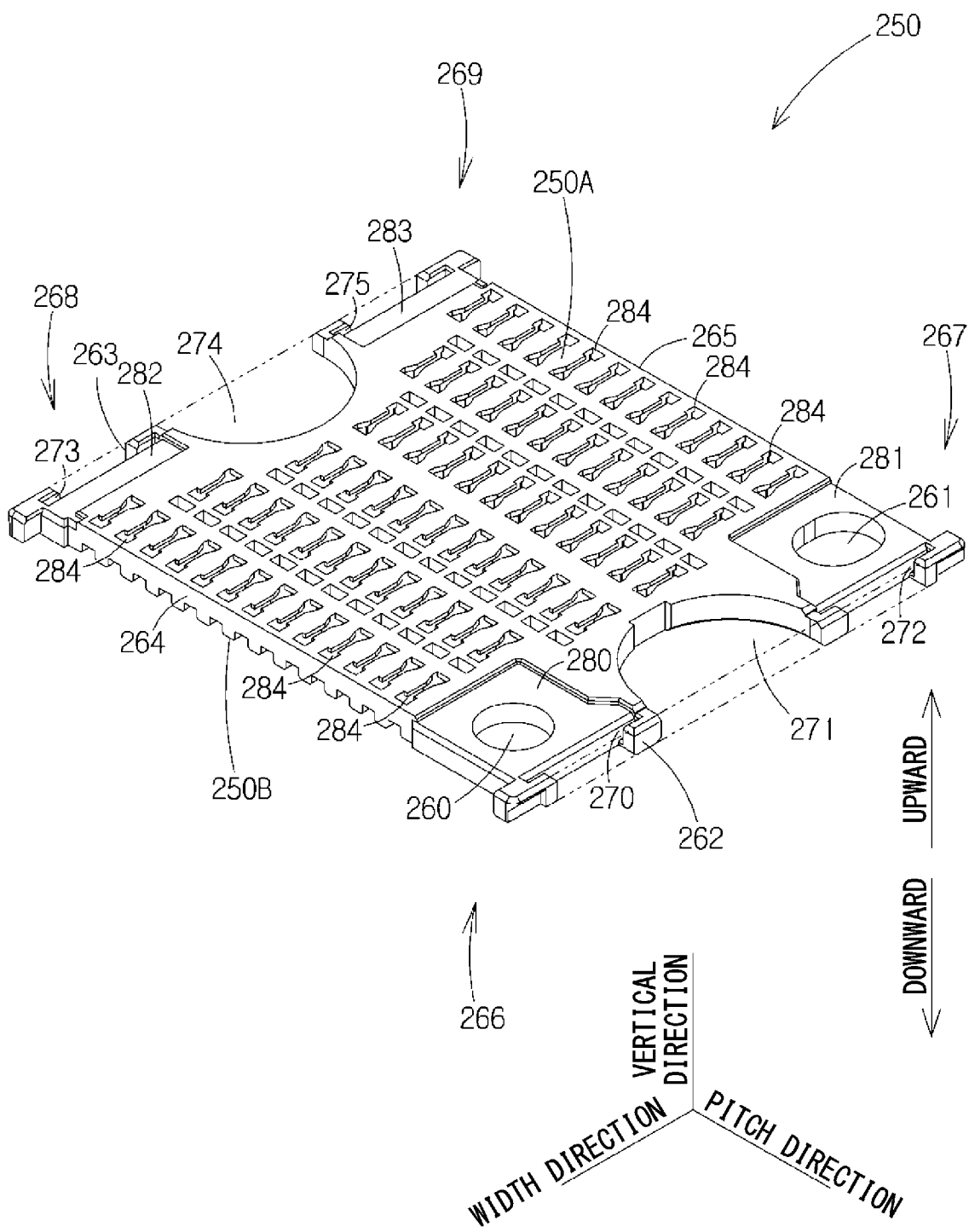
FIG. 5 is a perspective view of a housing (first embodiment)

FIG. 5 shows the housing 250. As shown in FIG. 5, the housing 250 includes a CPU board opposed surface 250A that is opposed to the CPU board 201 by facing upward, and an input-output board opposed surface 250B that is opposed to the input-output board 203 by facing downward. The housing 250 has a first positioning hole 260 and a second positioning hole 261. The first positioning hole 260 and the second positioning hole 261 are formed to penetrate the housing 250 in the vertical direction.

Referring back to FIG. 1, the overview of the assembly procedure of the information processing device 200 is described.

First, the connector 202 is surface-mounted on the input-output board 203. To be specific, the plurality of contact rows 251 are soldered to the plurality of pad rows 214, and further the first hold-down 252 and the like are soldered to the corresponding pads 216.

Next, the input-output board 203 on which the connector 202 is mounted is attached to the support board 204. At this time, the first nut 231 penetrates the first bolt fastening hole 217, and the second nut 232 penetrates the second bolt fastening hole 218. Likewise, the first positioning pin 233 penetrates the first penetrating hole 219 and the first positioning hole 260 in this recited order, and the second positioning pin 234 penetrates the second penetrating hole 220 and the second positioning hole 261 in this recited order.

Then, the CPU board 201 is attached to the support board 204 in such a way that the CPU board 201 overlaps the connector 202. At this time, the first positioning pin 233 penetrates the first positioning hole 209, and the second positioning pin 234 penetrates the second positioning hole 210. In this state, a first bolt 211 is fastened to the first nut 231 through the first bolt fastening hole 207, and a second bolt 212 is fastened to the second nut 232 through the second bolt fastening hole 208. In this manner, the connector 202 is interposed between the CPU board 201 and the input-output board 203, and thereby the plurality of pads 215 of the input-output board 203 and the plurality of pads 206 of the CPU board 201 are respectively electrically connected through the plurality of contacts 300.

Further, the first positioning pin 233 is inserted into the first positioning hole 260 of the connector 202 and the first positioning hole 209 of the CPU board 201, and the second positioning pin 234 is inserted into the second positioning hole 261 of the connector 202 and the second positioning hole 210 of the CPU board 201, and thereby highly accurate positioning of the CPU board 201 with respect to the connector 202 is achieved.

The connector 202 is described hereinafter in further detail.

As shown in FIG. 5, the housing 250 is formed in a rectangular flat-plate shape. Specifically, the housing 250 includes a first pitch side surface 262, a second pitch side surface 263, a first width side surface 264, and a second width side surface 265. The first pitch side surface 262 and the second pitch side surface 263 are side surfaces orthogonal to the pitch direction. The first pitch side surface 262 and the second pitch side surface 263 are surfaces opposed to each other. The first width side surface 264 and the second width side surface 265 are side surfaces orthogonal to the width direction. The first width side surface 264 and the second width side surface 265 are surfaces opposed to each other.

The housing 250 further includes a first corner part 266, a second corner part 267, a third corner part 268, and a fourth corner part 269. The first corner part 266 is a corner at which the first pitch side surface 262 and the first width side surface 264 intersect. The second corner part 267 is a corner at which the first pitch side surface 262 and the second width side surface 265 intersect. The third corner part 268 is a corner at which the second pitch side surface 263 and the first width side surface 264 intersect. The fourth corner part 269 is a corner at which the second pitch side surface 263 and the second width side surface 265 intersect. Thus, the first corner part 266 and the fourth corner part 269 are located at diagonal positions of the rectangular housing 250 when viewed from above. Likewise, the second corner part 267 and the third corner part 268 are located at diagonal positions of the rectangular housing 250 when viewed from above. The above-described first positioning hole 260 is formed at the first corner part 266. The second positioning hole 261 is formed at the second corner part 267. The housing 250 has only two positioning holes.

On the first pitch side surface 262, a first hold-down press-fit groove 270, a first nut notch 271, and a second hold-down press-fit groove 272 are formed in this recited order from the first width side surface 264 to the second width side surface 265.

On the second pitch side surface 263, a third hold-down press-fit groove 273, a second nut notch 274, a fourth hold-down press-fit groove 275 are formed in this recited order from the first width side surface 264 to the second width side surface 265.

On the CPU board opposed surface 250A, a first hold-down accommodation recess 280, a second hold-down accommodation recess 281, a third hold-down accommodation recess 282, and a fourth hold-down accommodation recess 283 are formed.

On the housing 250, a plurality of contact accommodation parts 284 are further formed.

The first hold-down press-fit groove 270 is a groove for holding the first hold-down 252 by press-fitting.

The second hold-down press-fit groove 272 is a groove for holding the second hold-down 253 by press-fitting.

The third hold-down press-fit groove 273 is a groove for holding the third hold-down 254 by press-fitting.

The fourth hold-down press-fit groove 275 is a groove for holding the fourth hold-down 255 by press-fitting.

The first nut notch 271 is a notch for avoiding the physical interference between the first nut 231 and the housing 250. In order to avoid the physical interference between the first nut 231 and the housing 250 shown in FIG. 1, the housing 250 may be provided with a hole that allows the first nut 231 to penetrate, instead of the first nut notch 271.

The second nut notch 274 is a notch for avoiding the physical interference between the second nut 232 and the housing 250 shown in FIG. 1. In order to avoid the physical interference between the second nut 232 and the housing 250 shown in FIG. 1, it is feasible to form a hole for the second nut 232 to penetrate on the housing 250 rather than forming the second nut notch 274 on the housing 250.

Referring back to FIG. 5, the first hold-down accommodation recess 280 is formed to accommodate the first hold-down 252 so that the first hold-down 252 attached to the housing 250 does not come closer to the CPU board 201 beyond the CPU board opposed surface 250A. The first hold-down accommodation recess 280 is formed at the first corner part 266. The first hold-down accommodation recess 280 is formed to surround the first positioning hole 260 when viewed from above. The depth of the first hold-down accommodation recess 280 is greater than the thickness of the first hold-down 252.

The second hold-down accommodation recess 281 is formed to accommodate the second hold-down 253 so that the second hold-down 253 attached to the housing 250 does not come closer to the CPU board 201 beyond the CPU board opposed surface 250A. The second hold-down accommodation recess 281 is formed at the second corner part 267. The second hold-down accommodation recess 281 is formed to surround the second positioning hole 261 when viewed from above. The depth of the second hold-down accommodation recess 281 is greater than the thickness of the second hold-down 253.

The third hold-down accommodation recess 282 is formed to accommodate the third hold-down 254 so that the third hold-down 254 attached to the housing 250 does not come closer to the CPU board 201 beyond the CPU board opposed surface 250A. The third hold-down accommodation recess 282 is formed at the third corner part 268. The depth of the third hold-down accommodation recess 282 is greater than the thickness of the third hold-down 254.

The fourth hold-down accommodation recess 283 is formed to accommodate the fourth hold-down 255 so that the fourth hold-down 255 attached to the housing 250 does not come closer to the CPU board 201 beyond the CPU board opposed surface 250A. The fourth hold-down accommodation recess 283 is formed at the fourth corner part 269. The depth of the fourth hold-down accommodation recess 283 is greater than the thickness of the fourth hold-down 255.

Each of the contact accommodation parts 284 is a part that accommodates each of the contacts 300. Each of the contact accommodation parts 284 is formed to penetrate the housing 250 in the vertical direction.

Figure 6:
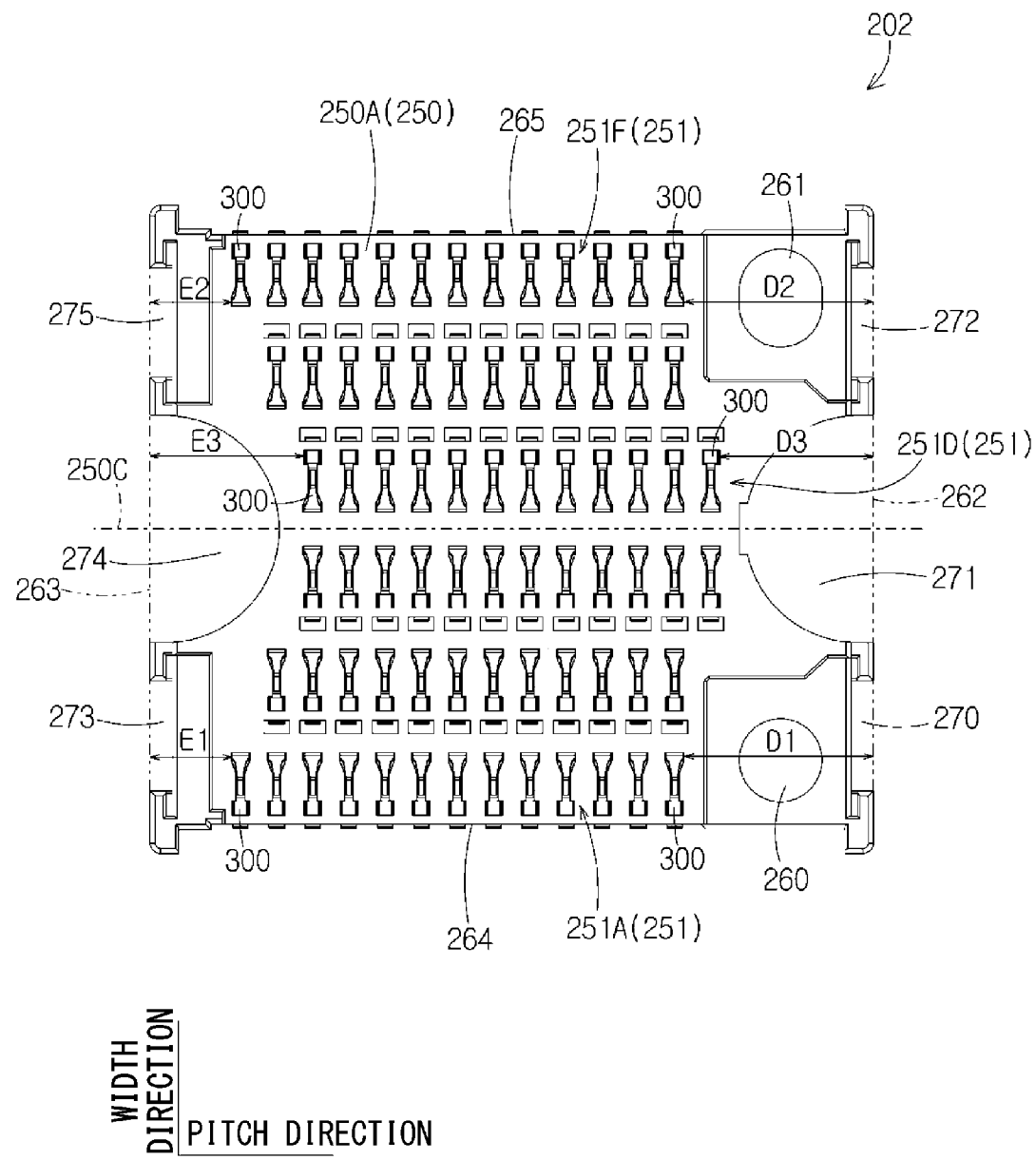
FIG. 6 is a plan view showing the connector where hold-downs are omitted (first embodiment)

FIG. 6 shows the connector 202 viewed from above. Note that, however, the first hold-down 252, the second hold-down 253, the third hold-down 254, and the fourth hold-down 255 are not shown for the sake of convenience of description.

As shown in FIG. 6, the first hold-down press-fit groove 270 and the like are formed on the first pitch side surface 262. Thus, the first pitch side surface 262 exists in a discontinuous manner in the width direction. For the following description, a part of the first pitch side surface 262 which is missing due to the formation of the first hold-down press-fit groove 270 or the like is indicated by a chain double-dashed line, and the first pitch side surface 262 is specified by drawing a leader line of the first pitch side surface 262 from this chain double-dashed line.

Likewise, the third hold-down press-fit groove 273 and the like are formed on the second pitch side surface 263. Thus, the second pitch side surface 263 exists in a discontinuous manner in the width direction. For the following description, a part of the second pitch side surface 263 which is missing due to the formation of the third hold-down press-fit groove 273 or the like is indicated by a chain double-dashed line, and the second pitch side surface 263 is specified by drawing a leader line of the second pitch side surface 263 from this chain double-dashed line.

As shown in FIG. 6, the plurality of contact rows 251 are disposed to be symmetric with respect to a halving line 250C that divides the housing 250 into two halves. Among the plurality of contact rows 251, particular attention is focused on a contact row 251A, a contact row 251D, and a contact row 251F.

The contact row 251A, the contact row 251D, and the contact row 251F extend from the first pitch side surface 262 to the second pitch side surface 263.

The first positioning hole 260 is adjacent to the contact row 251A in the pitch direction. The first positioning hole 260 is disposed between the first pitch side surface 262 indicated by the chain double-dashed line and the contact row 251A.

Likewise, the second positioning hole 261 is adjacent to the contact row 251F in the pitch direction. The second positioning hole 261 is disposed between the first pitch side surface 262 indicated by the chain double-dashed line and the contact row 251F.

The distance between the contact row 251A and the first pitch side surface 262 in the pitch direction is defined as a distance D1. Specifically, the distance D1 is the distance between the contact 300 that is closest to the first pitch side surface 262 among the plurality of contacts 300 forming the contact row 251A and the first pitch side surface 262.

Likewise, the distance between the contact row 251F and the first pitch side surface 262 in the pitch direction is defined as a distance D2. Specifically, the distance D2 is the distance between the contact 300 that is closest to the first pitch side surface 262 among the plurality of contacts 300 forming the contact row 251F and the first pitch side surface 262.

Likewise, the distance between the contact row 251D and the first pitch side surface 262 in the pitch direction is defined as a distance D3. Specifically, the distance D3 is the distance between the contact 300 that is closest to the first pitch side surface 262 among the plurality of contacts 300 forming the contact row 251D and the first pitch side surface 262.

In this embodiment, the relationship of D1=D2 is established. Further, in this embodiment, the relationships of D3<D1 and D3<D2 are established. In simpler terms, the contact row 251D is closer to the first pitch side surface 262 than the contact row 251A is, and is also closer to the first pitch side surface 262 than the contact row 251F is.

The first nut notch 271 is open to the first pitch side surface 262 indicated by the chain double-dashed line, and formed between the first pitch side surface 262 indicated by the chain double-dashed line and the contact row 251D.

The distance between the contact row 251A and the second pitch side surface 263 in the pitch direction is defined as a distance E1. Specifically, the distance E1 is the distance between the contact 300 that is closest to the second pitch side surface 263 among the plurality of contacts 300 forming the contact row 251A and the second pitch side surface 263.

Likewise, the distance between the contact row 251F and the second pitch side surface 263 in the pitch direction is defined as a distance E2. Specifically, the distance E2 is the distance between the contact 300 that is closest to the second pitch side surface 263 among the plurality of contacts 300 forming the contact row 251F and the second pitch side surface 263.

Likewise, the distance between the contact row 251D and the second pitch side surface 263 in the pitch direction is defined as a distance E3. Specifically, the distance E3 is the distance between the contact 300 that is closest to the second pitch side surface 263 among the plurality of contacts 300 forming the contact row 251D and the second pitch side surface 263.

In this embodiment, the relationship of E1=E2 is established. Further, in this embodiment, the relationships of E3>E1 and E3>E2 are established. In simpler terms, the contact row 251D is farther from the second pitch side surface 263 than the contact row 251A is, and is also farther from the second pitch side surface 263 than the contact row 251F is.

The second nut notch 274 is open to the second pitch side surface 263 indicated by the chain double-dashed line, and formed between the second pitch side surface 263 indicated by the chain double-dashed line and the contact row 251D.

The first positioning hole 260, the second positioning hole 261, the first hold-down 252, the second hold-down 253, the third hold-down 254, and the fourth hold-down 255 are hereinafter described in further detail with reference to FIGS. 7 to 9. FIG. 8 is an enlarged view of the part A in FIG. 7. FIG. 9 is an enlarged view of the part B in FIG. 7.

As shown in FIG. 8, the first positioning hole 260 is a round hole that penetrates the housing 250 in the vertical direction, and it has an inner edge 260A.

The first hold-down 252 includes a reinforcing plate part 252A and two soldering parts 252B.

The reinforcing plate part 252A is disposed to cover the CPU board opposed surface 250A around the first positioning hole 260. The reinforcing plate part 252A is accommodated in the first hold-down accommodation recess 280 that is formed on the CPU board opposed surface 250A. Thus, the reinforcing plate part 252A is farther from the CPU board 201 than a part 250D of the CPU board opposed surface 250A in which the first hold-down accommodation recess 280 is not formed, while covering the CPU board opposed surface 250A. Therefore, the elastic deformation of each contact 300 is not hindered when pressing the CPU board 201 against the connector 202.

Each of the soldering parts 252B projects from the reinforcing plate part 252A toward the input-output board 203 and is connectable by soldering to the corresponding pad 216 of the input-output board 203. One of the two soldering parts 252B is press-fit into the first hold-down press-fit groove 270 formed on the first pitch side surface 262, and thereby the first hold-down 252 is held by the housing 250. Each of the soldering parts 252B projects downward beyond the input-output board opposed surface 250B of the housing 250 shown in FIG. 5.

Referring back to FIG. 8, the reinforcing plate part 252A has a penetrating hole 252C. The penetrating hole 252C is a round hole that penetrates the reinforcing plate part 252A in the vertical direction, and it has an inner edge 252D.

The penetrating hole 252C is larger than the first positioning hole 260. To be specific, an inside diameter 252E of the penetrating hole 252C is greater than an inside diameter 260B of the first positioning hole 260.

The first hold-down 252 is disposed in such a way that the reinforcing plate part 252A does not cover the inner edge 260A of the first positioning hole 260 when viewed from above. Specifically, the first hold-down 252 is disposed in such a way that the inner edge 260A of the first positioning hole 260 is located radially inward with respect to the inner edge 252D of the penetrating hole 252C when viewed from above.

The reinforcing plate part 252A made of metal thereby does not hinder the positioning function of the inner edge 260A of the first positioning hole 260 and the first positioning pin 233. Further, the reinforcing plate part 252A made of metal reduces the degree of deformation when the first positioning hole 260 is deformed outward in the radial direction due to contact with the first positioning pin 233, which avoids a significant decrease in positioning accuracy of the positioning function.

As shown in FIG. 9, the second positioning hole 261 is a slotted hole that penetrates the housing 250 in the vertical direction. The second positioning hole 261 extends to come closer to the first positioning hole 260. The second positioning hole 261 is elongated in the width direction. The second positioning hole 261 has an inner edge 261A.

The second hold-down 253 includes a reinforcing plate part 253A and two soldering parts 253B.

The reinforcing plate part 253A is disposed to cover the CPU board opposed surface 250A around the second positioning hole 261. The reinforcing plate part 253A is accommodated in the second hold-down accommodation recess 281 that is formed on the CPU board opposed surface 250A. Thus, the reinforcing plate part 253A is farther from the CPU board 201 than the part 250D of the CPU board opposed surface 250A in which the second hold-down accommodation recess 281 is not formed, while covering the CPU board opposed surface 250A. Therefore, the elastic deformation of each contact 300 is not hindered when pressing the CPU board 201 against the connector 202.

Each of the soldering parts 253B projects from the reinforcing plate part 253A toward the input-output board 203 and is connectable by soldering to the corresponding pad 216 of the input-output board 203. One of the two soldering parts 253B is press-fit into the second hold-down press-fit groove 272 formed on the first pitch side surface 262, and thereby the second hold-down 253 is held by the housing 250. Each of the soldering parts 253B projects downward beyond the input-output board opposed surface 250B of the housing 250 shown in FIG. 5.

Referring back to FIG. 9, the reinforcing plate part 253A has a penetrating hole 253C. The penetrating hole 253C is a slotted hole that penetrates the reinforcing plate part 253A in the vertical direction, and it has an inner edge 253D.

The penetrating hole 253C is larger than the second positioning hole 261. To be specific, the inner edge 253D of the penetrating hole 253C has two straight edge parts 253E that are opposed to each other in the pitch direction. The inner edge 261A of the second positioning hole 261 has two straight edge parts 261B that are opposed to each other in the pitch direction. A distance 253F between the two straight edge parts 253E is longer than a distance 261C between the two straight edge parts 261B.

The second hold-down 253 is disposed in such a way that the reinforcing plate part 253A does not cover the inner edge 261A of the second positioning hole 261 when viewed from above. Specifically, the second hold-down 253 is disposed in such a way that the inner edge 261A of the second positioning hole 261 is located inward with respect to the inner edge 253D of the penetrating hole 253C when viewed from above. To be specific, the second hold-down 253 is disposed in such a way that the two straight edge parts 261B are located between the two straight edge parts 253E.

The reinforcing plate part 253A made of metal thereby does not hinder the positioning function of the inner edge 261A of the second positioning hole 261 and the second positioning pin 234. Further, the reinforcing plate part 253A made of metal reduces the degree of deformation when the second positioning hole 261 is deformed outward due to contact with the second positioning pin 234, which avoids a significant decrease in positioning accuracy of the positioning function.

As shown in FIG. 4, in this embodiment, while the housing 250 is formed integrally, the first hold-down 252 and the second hold-down 253 are separate parts. Thus, referring to FIGS. 7 to 9, the relative positional relationship between the first positioning hole 260 and the second positioning hole 261 in the housing 250 is more easily manageable compared with the relative positional relationship between the penetrating hole 252C of the first hold-down 252 and the penetrating hole 253C of the second hold-down 253. Therefore, since the reinforcing plate part 252A of the first hold-down 252 does not cover the inner edge 260A of the first positioning hole 260 when viewed from above as shown in FIG. 8 and the reinforcing plate part 253A of the second hold-down 253 does not cover the inner edge 261A of the second positioning hole 261 when viewed from above as shown in FIG. 9, the positioning function by the first positioning hole 260 and the second positioning hole 261 is reliably exerted, which achieves high positioning accuracy of the CPU board 201 with respect to the connector 202.

Referring back to FIG. 7, the third hold-down 254 includes a covering plate part 254A and two soldering parts 254B.

The covering plate part 254A is accommodated in the third hold-down accommodation recess 282 that is formed on the CPU board opposed surface 250A. Thus, the covering plate part 254A is farther from the CPU board 201 than the part 250D of the CPU board opposed surface 250A in which the third hold-down accommodation recess 282 is not formed, while covering the CPU board opposed surface 250A. Therefore, the elastic deformation of each contact 300 is not hindered when pressing the CPU board 201 against the connector 202.

Each of the soldering parts 254B projects from the covering plate part 254A toward the input-output board 203 and is connectable by soldering to the corresponding pad 216 of the input-output board 203. One of the two soldering parts 254B is press-fit into the third hold-down press-fit groove 273 formed on the second pitch side surface 263, and thereby the third hold-down 254 is held by the housing 250. Each of the soldering parts 254B projects downward beyond the input-output board opposed surface 250B of the housing 250 shown in FIG. 5.

Referring back to FIG. 7, the fourth hold-down 255 includes a covering plate part 255A and two soldering parts 255B.

The covering plate part 255A is accommodated in the fourth hold-down accommodation recess 283 that is formed on the CPU board opposed surface 250A. Thus, the covering plate part 255A is farther from the CPU board 201 than the part 250D of the CPU board opposed surface 250A in which the fourth hold-down accommodation recess 283 is not formed, while covering the CPU board opposed surface 250A. Therefore, the elastic deformation of each contact 300 is not hindered when pressing the CPU board 201 against the connector 202.

Each of the soldering parts 255B projects from the covering plate part 255A toward the input-output board 203 and is connectable by soldering to the corresponding pad 216 of the input-output board 203. One of the two soldering parts 255B is press-fit into the fourth hold-down press-fit groove 275 formed on the second pitch side surface 263, and thereby the fourth hold-down 255 is held by the housing 250. Each of the soldering parts 255B projects downward beyond the input-output board opposed surface 250B of the housing 250 shown in FIG. 5.

Each of the contacts 300 and each of the contact accommodation parts 284 are described hereinafter in detail with reference to FIGS. 10 to 13.

Figure 10:
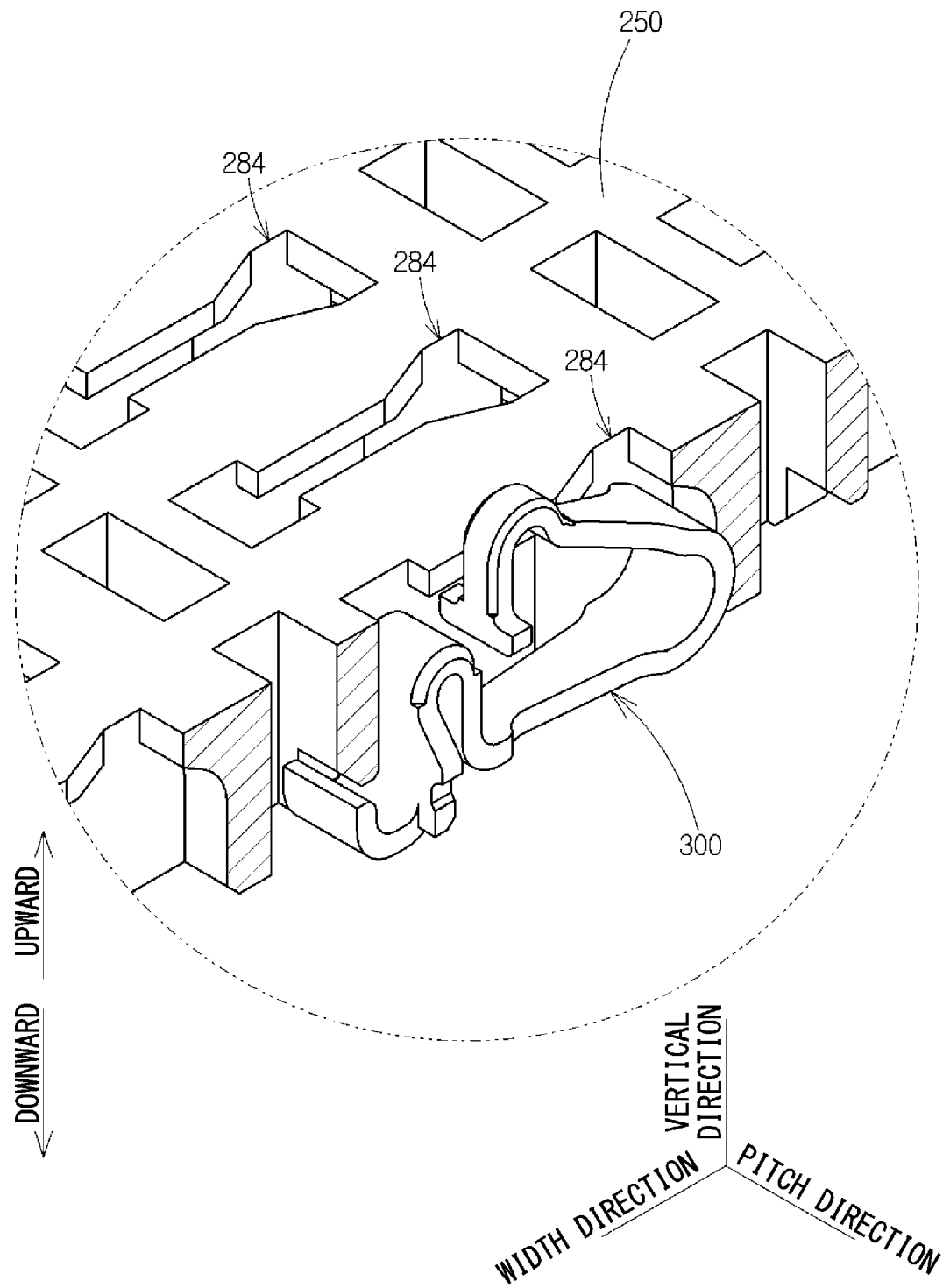
FIG. 10 is a partially cutout perspective view of the housing to which a contact is attached (first embodiment)
Figure 11:
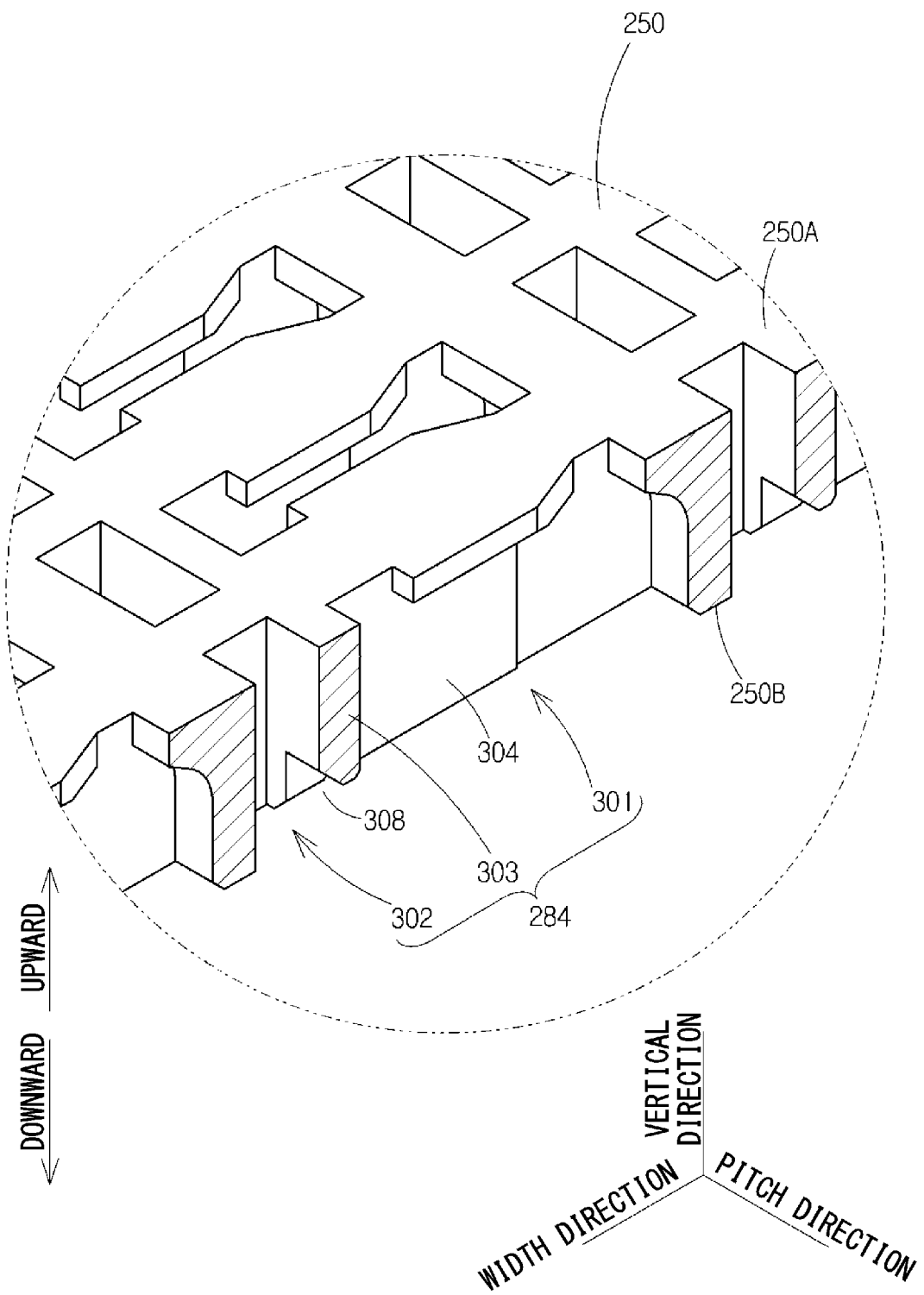
FIG. 11 is a partially cutout perspective view of the housing (first embodiment)

As shown in FIGS. 10 and 11, each contact accommodation part 284 is formed to attach each contact 300 to the housing 250. As shown in FIG. 11, each contact accommodation part 284 is composed of a press-fitting space 301, a solder connection checking hole 302, and a separating wall 303. The press-fitting space 301 and the solder connection checking hole 302 are formed separately from each other in the width direction. The separating wall 303 is a wall that separates the press-fitting space 301 from the solder connection checking hole 302 in the width direction.

Figure 12:
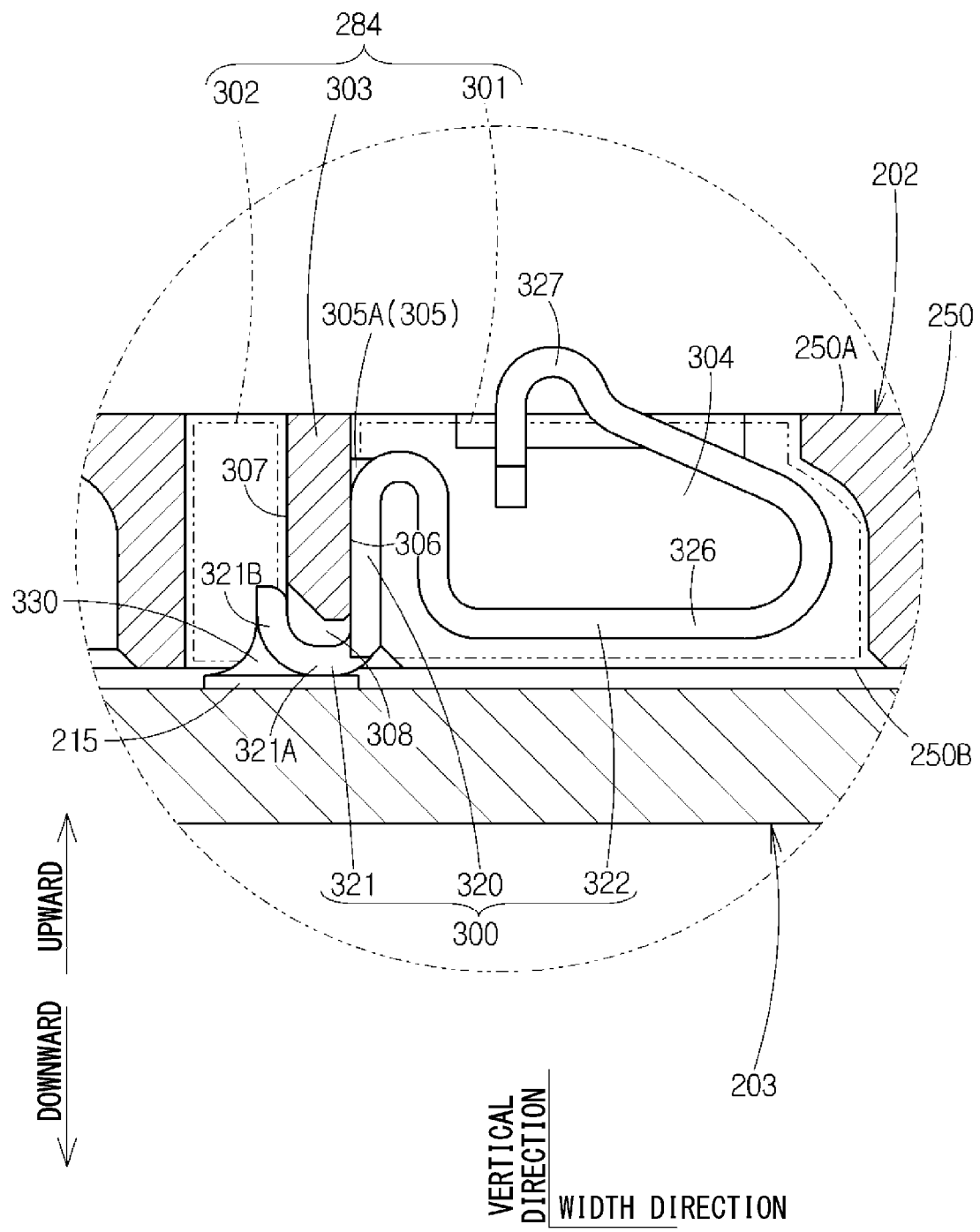
FIG. 12 is a partial cross-sectional view of the housing to which the contact is attached (first embodiment)

The press-fitting space 301 is formed as a penetrating hole that penetrates the housing 250 in the vertical direction. Specifically, the press-fitting space 301 is open to the CPU board opposed surface 250A and the input-output board opposed surface 250B. The housing 250 includes, for each press-fitting space 301, two pitch partition surfaces 304 that partitions the press-fitting space 301 in the pitch direction. FIG. 11 shows only one of the two pitch partition surfaces 304. In FIG. 12, the cross-sectional shapes of the press-fitting space 301 and the solder connection checking hole 302 are specified by chain double-dashed lines. As shown in FIG. 12, a press-fit groove 305 that extends in the vertical direction is formed on each pitch partition surface 304. Each pitch partition surface 304 includes a press-fit surface 305A that partitions the press-fit groove 305 in the pitch direction.

Referring back to FIG. 11, the solder connection checking hole 302 is a penetrating hole that penetrates the housing 250 in the vertical direction. Specifically, the solder connection checking hole 302 is open to the CPU board opposed surface 250A and the input-output board opposed surface 250B.

The separating wall 303 is a wall that spatially separates the press-fitting space 301 from the solder connection checking hole 302 as described above, and it is formed between the press-fitting space 301 and the solder connection checking hole 302. As shown in FIG. 12, the separating wall 303 includes a first separating surface 306 that partitions the press-fitting space 301 in the width direction, and a second separating surface 307 that partitions the solder connection checking hole 302 in the width direction. The first separating surface 306 and the second separating surface 307 are surfaces orthogonal to the width direction. As shown in FIGS. 11 and 12, the separating wall 303 has a notch 308 that is open to the press-fitting space 301 and the solder connection checking hole 302 and is also open to the input-output board opposed surface 250B. The notch 308 is formed at the lower end of the separating wall 303.

Figure 13:
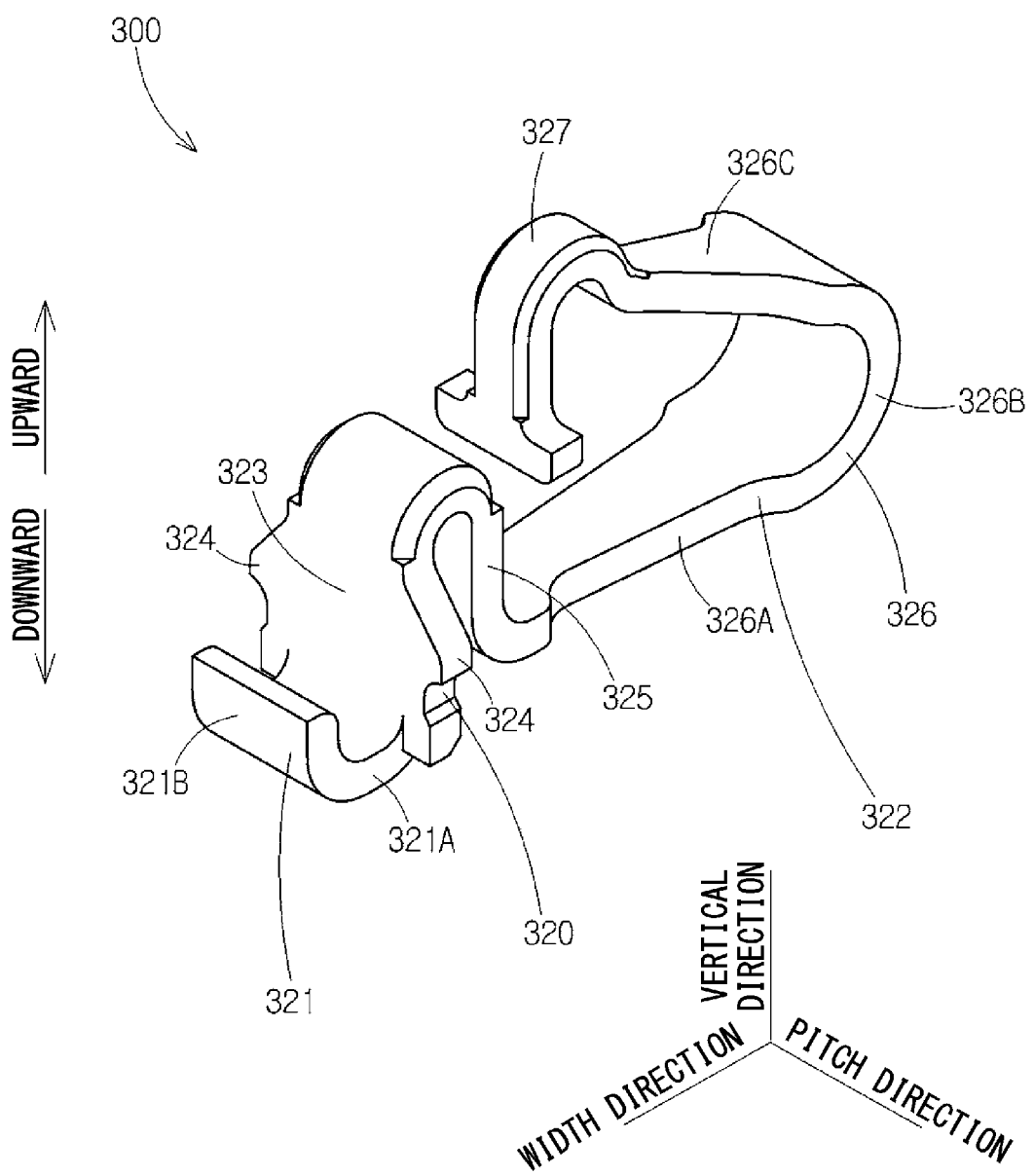
FIG. 13 is a perspective view of the contact (first embodiment)

FIG. 13 is a perspective view of each contact 300. As shown in FIG. 13, each contact 300 includes a press-fit part 320, a soldering part 321, and an electrical contact spring piece 322.

The press-fit part 320 is a part to be press-fit into the press-fitting space 301 shown in FIG. 12. Specifically, the press-fit part 320 is press-fit into the press-fitting space 301, and thereby each contact 300 is held by the housing 250. Referring back to FIG. 13, the press-fit part 320 is a plate body that is orthogonal to the width direction, and it includes a press-fit part main body 323 and two press-fit claws 324. The two press-fit claws 324 are formed to project in the pitch direction from the both ends of the press-fit part main body 323 in the pitch direction.

The soldering part 321 is a part that is connectable by soldering to the corresponding pad 215 of the input-output board 203 shown in FIG. 1. As shown in FIG. 13, the soldering part 321 includes a horizontal extension part 321A that extends in the width direction from the lower end of the press-fit part 320 and a curve part 321B that curves upward from the horizontal extension part 321A.

The electrical contact spring piece 322 is a part that functions as an electrical contact point of the CPU board 201 shown in FIG. 2 with the corresponding pad 206. As shown in FIG. 13, the electrical contact spring piece 322 includes a spring piece joining part 325, an easily elastically deformable part 326, and a contact part 327. The spring piece joining part 325, the easily elastically deformable part 326, and the contact part 327 are continuous in this recited order.

The spring piece joining part 325 extends downward from the upper end of the press-fit part 320.

The easily elastically deformable part 326 extends from the lower end of the spring piece joining part 325 and is formed in a U-shape that is convex in the width direction. Specifically, the easily elastically deformable part 326 includes a lower straight part 326A, a curve part 326B, and an upper straight part 326C. The lower straight part 326A, the curve part 326B, and the upper straight part 326C are continuous in this recited order. The lower straight part 326A and the upper straight part 326C are opposed to each other in the vertical direction. The lower straight part 326A and the upper straight part 326C are joined through the curve part 326B.

The contact part 327 is a part that can come into electrical contact with the corresponding pad 206 of the CPU board 201 shown in FIG. 2. The contact part 327 is placed at the end of the upper straight part 326C of the easily elastically deformable part 326, and it is formed to curve to be convex upward.

FIG. 12 shows the state where each contact 300 is attached to each contact accommodation part 284. In order to attach each contact 300 to each contact accommodation part 284, each contact 300 is press-fit into the press-fitting space 301 of each contact accommodation part 284 from the input-output board opposed surface 250B side. At this time, the two press-fit claws 324 of the press-fit part 320 shown in FIG. 13 respectively bite into the two pitch partition surfaces 304. In more detail, each of the two press-fit claws 324 of the press-fit part 320 shown in FIG. 13 bites into the press-fit surface 305A of the press-fit groove 305 formed on the two pitch partition surfaces 304.

When each contact 300 is attached to each contact accommodation part 284, the easily elastically deformable part 326 is accommodated in the press-fitting space 301, and the contact part 327 thereby projects upward from the CPU board opposed surface 250A. Further, the soldering part 321 passes through the notch 308 and reaches the solder connection checking hole 302. In more detail, the horizontal extension part 321A of the soldering part 321 extends in the width direction inside the notch 308, and the curve part 321B is located in the solder connection checking hole 302. In this state, while the press-fit part 320 comes into contact with the separating wall 303 of the housing 250, the soldering part 321 and the electrical contact spring piece 322 do not come into contact with the housing 250.

FIG. 12 shows the state where the soldering part 321 is connected by soldering to the corresponding pad 215 of the input-output board 203. As shown in FIG. 12, when the soldering part 321 is connected by soldering to the pad 215, a solder fillet 330 is formed between the curve part 321B of the soldering part 321 and the pad 215. In general, the soldering part 321 is regarded as being normally soldered to the pad 215 upon formation of the solder fillet 330. Thus, in this embodiment, the housing 250 is provided with the solder connection checking hole 302, so that the presence of the solder fillet 330 is checked from above through the solder connection checking hole 302. This enables determining whether the solder connection of each contact 300 is successfully made or not after surface-mounting the connector 202 onto the input-output board 203.

In this embodiment, the separating wall 303 that separates the press-fitting space 301 from the solder connection checking hole 302 is formed as described above. The presence of the separating wall 303 prevents shavings of the housing 250, which can be generated when press-fitting the press-fit part 320 into the press-fitting space 301, from moving into the solder connection checking hole 302. This allows checking the solder fillet 330 from above through the solder connection checking hole 302 with no problem.

Figure 14:
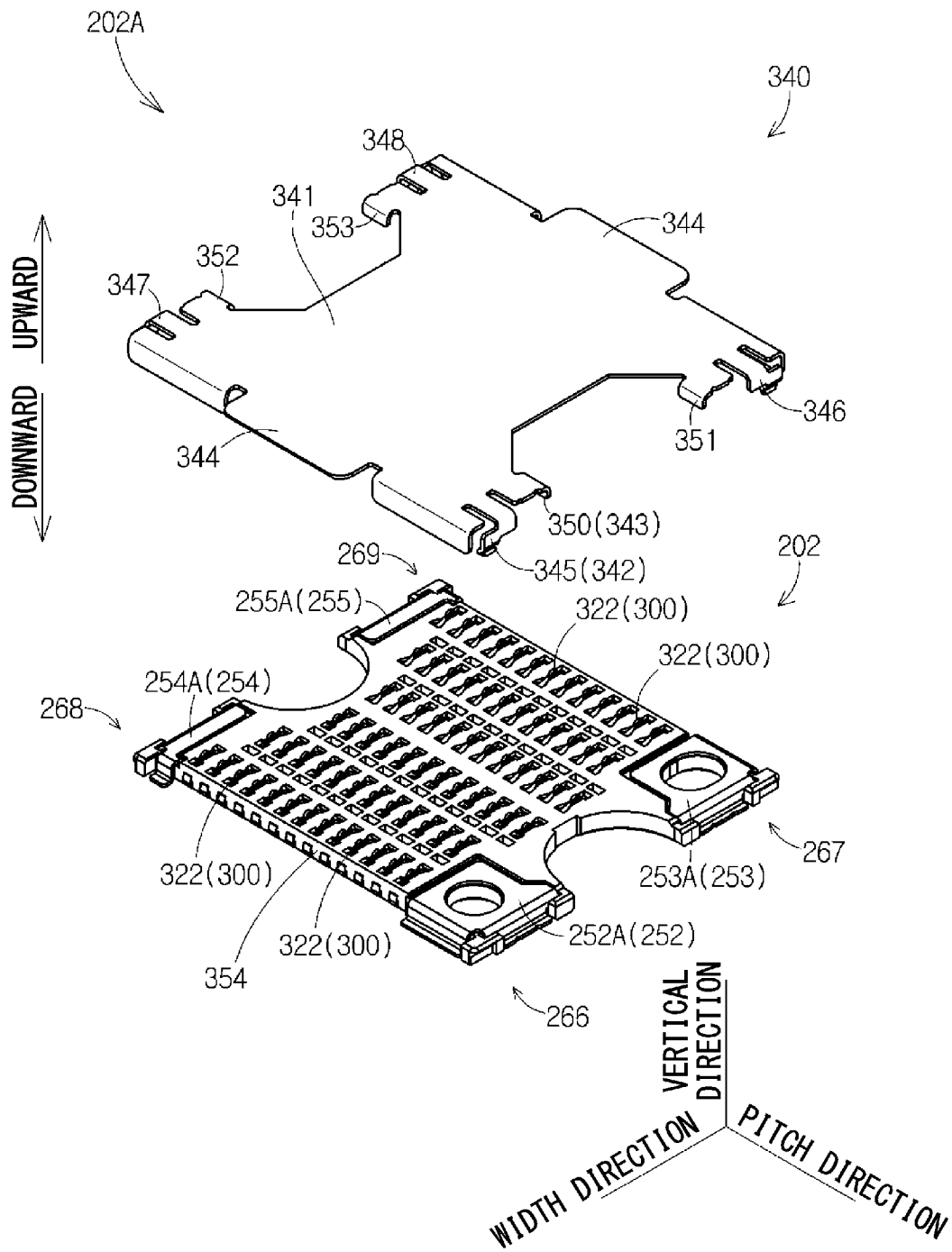
FIG. 14 is an exploded perspective view of the connector with a suction cover (first embodiment)
Figure 15:
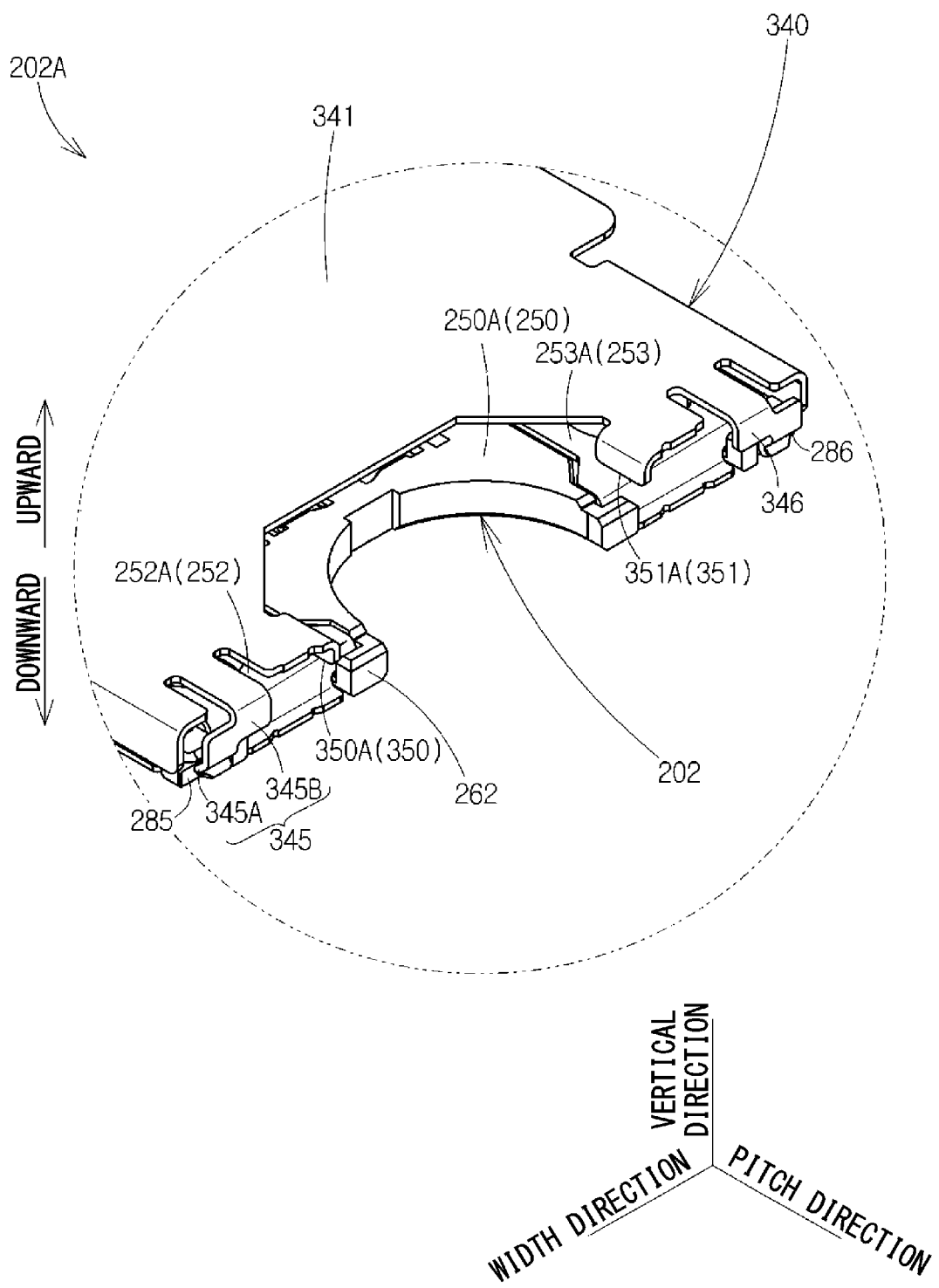
FIG. 15 is a partial perspective view of the connector with a suction cover (first embodiment)

Hereinafter, a connector 202A with a suction cover is described with reference to FIGS. 14 and 15. The connector 202A with a suction cover includes a connector 202 and a suction cover 340 that is detachable from the connector 202. As shown in FIGS. 14 and 15, the suction cover 340 is temporarily attached to the connector 202 in order to hold the connector 202 by a suction nozzle, which is not shown, when surface-mounting the connector 202 onto the input-output board 203.

As shown in FIG. 14, the suction cover 340 includes a suction plate part 341, a plurality of attachment spring pieces 342, a plurality of main deformation restraining parts 343, and two removal hooks 344. The suction cover 340 is formed by punching and bending a metal plate such as a stainless steel plate, for example.

The suction plate part 341 is a flat plate that covers and protects the electrical contact spring piece 322 of each contact 300 and can be sucked by a suction nozzle, which is not shown. The thickness direction of the suction plate part 341 is parallel to the vertical direction when attached to the connector 202.

The plurality of attachment spring pieces 342 are configured to catch on the connector 202 so that the suction plate part 341 is detachable from the connector 202. The plurality of attachment spring pieces 342 include a first attachment spring piece 345, a second attachment spring piece 346, a third attachment spring piece 347, and a fourth attachment spring piece 348.

The first attachment spring piece 345 corresponds to the first corner part 266 in the state where the suction cover 340 is attached to the connector 202.

Likewise, the second attachment spring piece 346 corresponds to the second corner part 267 in the state where the suction cover 340 is attached to the connector 202.

Likewise, the third attachment spring piece 347 corresponds to the third corner part 268 in the state where the suction cover 340 is attached to the connector 202.

Likewise, the fourth attachment spring piece 348 corresponds to the fourth corner part 269 in the state where the suction cover 340 is attached to the connector 202.

As shown in FIG. 15, the first pitch side surface 262 of the housing 250 has a recess 285 and a recess 286. The recess 285 is disposed to correspond to the first corner part 266. The recess 286 is disposed to correspond to the second corner part 267.

The first attachment spring piece 345 includes a protrusion 345A, and a spring piece 345B that supports the protrusion 345A in such a way that the protrusion 345A is displaceable in the pitch direction. The second attachment spring piece 346, the third attachment spring piece 347, and the fourth attachment spring piece 348 have the same structure.

Referring back to FIG. 14, the plurality of main deformation restraining parts 343 project from the suction plate part 341 toward the CPU board opposed surface 250A in order to inhibit the suction plate part 341 from being deformed toward the CPU board opposed surface 250A in the state where the suction cover 340 is attached to the connector 202. The plurality of main deformation restraining parts 343 include a first main deformation restraining part 350, a second main deformation restraining part 351, a third main deformation restraining part 352, and a fourth main deformation restraining part 353.

The first main deformation restraining part 350 corresponds to the first corner part 266 in the state where the suction cover 340 is attached to the connector 202.

Likewise, the second main deformation restraining part 351 corresponds to the second corner part 267 in the state where the suction cover 340 is attached to the connector 202.

Likewise, the third main deformation restraining part 352 corresponds to the third corner part 268 in the state where the suction cover 340 is attached to the connector 202.

Likewise, the fourth main deformation restraining part 353 corresponds to the fourth corner part 269 in the state where the suction cover 340 is attached to the connector 202.

The first main deformation restraining part 350 and the second main deformation restraining part 351 are disposed between the first attachment spring piece 345 and the second attachment spring piece 346.

The third main deformation restraining part 352 and the fourth main deformation restraining part 353 are disposed between the third attachment spring piece 347 and the fourth attachment spring piece 348.

As shown in FIG. 15, the first main deformation restraining part 350 is formed by bending a part of the suction plate part 341 downward. In other words, the first main deformation restraining part 350 is formed to project downward from the suction plate part 341. The first main deformation restraining part 350 is disposed in such a way that a lower end 350A of the first main deformation restraining part 350 is opposed to the reinforcing plate part 252A of the first hold-down 252 in the vertical direction in the state where the suction cover 340 is attached to the connector 202.

Likewise, the second main deformation restraining part 351 is formed by bending a part of the suction plate part 341 downward. In other words, the second main deformation restraining part 351 is formed to project downward from the suction plate part 341. The second main deformation restraining part 351 is disposed in such a way that a lower end 351A of the second main deformation restraining part 351 is opposed to the reinforcing plate part 253A of the second hold-down 253 in the vertical direction in the state where the suction cover 340 is attached to the connector 202.

As shown in FIG. 14, the third main deformation restraining part 352 is formed by bending a part of the suction plate part 341 downward. In other words, the third main deformation restraining part 352 is formed to project downward from the suction plate part 341. The third main deformation restraining part 352 is disposed in such a way that a lower end of the third main deformation restraining part 352 is opposed to the covering plate part 254A of the third hold-down 254 in the vertical direction in the state where the suction cover 340 is attached to the connector 202.

Likewise, the fourth main deformation restraining part 353 is formed by bending a part of the suction plate part 341 downward. In other words, the fourth main deformation restraining part 353 is formed to project downward from the suction plate part 341. The fourth main deformation restraining part 353 is disposed in such a way that a lower end of the fourth main deformation restraining part 353 is opposed to the covering plate part 255A of the fourth hold-down 255 in the vertical direction in the state where the suction cover 340 is attached to the connector 202.

Thus, when the suction plate part 341 is deformed toward the CPU board opposed surface 250A, the first main deformation restraining part 350 and the second main deformation restraining part 351 come into contact with the first hold-down 252 and the second hold-down 253, respectively, and the third main deformation restraining part 352 and the fourth main deformation restraining part 353 come into contact with the third hold-down 254 and the fourth hold-down 255, respectively, thereby inhibiting the further deformation of the suction plate part 341. This prevents that the suction plate part 341 comes into contact with the electrical contact spring piece 322 of the plurality of contacts 300 to cause the plurality of contacts 300 to be broken.

Further, the first main deformation restraining part 350 and the second main deformation restraining part 351 are configured to be received by the first hold-down 252 and the second hold-down 253 respectively when the suction plate part 341 is deformed toward the CPU board opposed surface 250A. Likewise, the third main deformation restraining part 352 and the fourth main deformation restraining part 353 are configured to be received by the third hold-down 254 and the fourth hold-down 255 respectively when the suction plate part 341 is deformed toward the CPU board opposed surface 250A. Thus, the first main deformation restraining part 350, the second main deformation restraining part 351, the third main deformation restraining part 352, and the fourth main deformation restraining part 353 do not come into direct contact with the CPU board opposed surface 250A of the housing 250 when the suction plate part 341 is deformed toward the CPU board opposed surface 250A. This effectively inhibits the collision of the first main deformation restraining part 350, the second main deformation restraining part 351, the third main deformation restraining part 352, and the fourth main deformation restraining part 353 with the housing 250 to damage the housing 250 and inhibits the generation of shavings that can cause defective connection.

Note that, although the suction cover 340 includes a plurality of main deformation restraining parts 343 in the description of this embodiment, it may include only one main deformation restraining part 343.

As shown in FIG. 14, the two removal hooks 344 project from the suction plate part 341 in the width direction. Then, the two removal hooks 344 are disposed to project outward beyond an outer edge 354 of the connector 202 when viewed from above in the state where the suction cover 340 is attached to the connector 202. This allows a thumb and a forefinger, for example, to easily catch on the two removal hooks 344, respectively, which facilitates the removal of the suction cover 340 from the connector 202.

As shown in FIGS. 1 and 2, when the CPU board 201 is pressed against the connector 202 by using the first bolt 211 and the second bolt 212 as described above, the contact part 327 of the electrical contact spring piece 322 of each contact 300 shown in FIG. 12 is elastically displaced downward, and then the connector opposed surface 201A of the CPU board 201 shown in FIG. 2 comes into plane contact with the CPU board opposed surface 250A of the housing 250 of the connector 202 shown in FIG. 3. At this time, the connector opposed surface 201A of the CPU board 201 is not in contact with the first hold-down 252 and the like.

After that, when the CPU board 201 is further pressed against the connector 202 by using the first bolt 211 and the second bolt 212, the housing 250 moves downward relative to the first hold-down 252 and the like, with the soldering part 252B shown in FIG. 8 sliding on the first hold-down press-fit groove 270. Eventually, the connector opposed surface 201A of the CPU board 201 is received by the first hold-down 252 and the like that are soldered to the input-output board 203. This restricts the downward movement of the housing 250 relative to the first hold-down 252 and the like.

The first embodiment is described above, and the above-described first embodiment has the following features.

First Technical Idea: No. 0170

As shown in FIGS. 1 and 2, the connector 202 (board-to-board connector) is mounted on the input-output board 203 (first board). The connector 202 is interposed between the input-output board 203 and the CPU board 201 (second board), and thereby the plurality of pads 215 of the input-output board 203 and the plurality of pads 206 of the CPU board 201 are respectively electrically connected. As shown in FIG. 6, the connector 202 includes the rectangular flat-plate housing 250 having the first positioning hole 209 and the second positioning hole 210, and the contact row 251A (first contact row) and the contact row 251F (second contact row) held on the housing 250. The housing 250 includes the first pitch side surface 262 (first side surface) and the second pitch side surface 263 (second surface), which is an opposite side of the first pitch side surface 262. The contact row 251A and the contact row 251F extend from the first pitch side surface 262 to the second pitch side surface 263. The first positioning hole 260 is disposed between the first pitch side surface 262 and the contact row 251A, and the second positioning hole 261 is disposed between the first pitch side surface 262 and the contact row 251F. In this structure, the first positioning hole 260 and the second positioning hole 261 are concentrated on the first pitch side surface 262 side, which contributes to the size reduction of the connector 202.

Further, as shown in FIG. 6, the connector 202 further includes the contact row 251D (third contact row) that is disposed between the contact row 251A and the contact row 251F and extends from the first pitch side surface 262 to the second pitch side surface 263. The distance D1 between the contact row 251A and the first pitch side surface 262, the distance D2 between the contact row 251F and the first pitch side surface 262, and the distance D3 between the contact row 251D and the first pitch side surface 262 satisfy the relationships of D3<D1 and D3<D2. This structure enables an increase in the number of the contacts 300 by utilizing the space between the first positioning hole 260 and the second positioning hole 261.

Further, as shown in FIG. 6, the first nut notch 271 (notch) that is open to the first pitch side surface 262 is formed between the first positioning hole 260 and the second positioning hole 261. This structure allows the first nut notch 271 to be formed by utilizing the space between the first positioning hole 260 and the second positioning hole 261, which contributes to the size reduction of the connector 202.

Further, as shown in FIG. 6, the distance E1 between the contact row 251A and the second pitch side surface 263, the distance E2 between the contact row 251F and the second pitch side surface 263, and the distance E3 between the contact row 251D and the second pitch side surface 263 satisfy the relationships of E3>E1 and E3>E2. This structure allows a space between the contact row 251A and the contact row 251F in the vicinity of the second pitch side surface 263. This space can be used for forming the second nut notch 274, for example.

Figure 7:
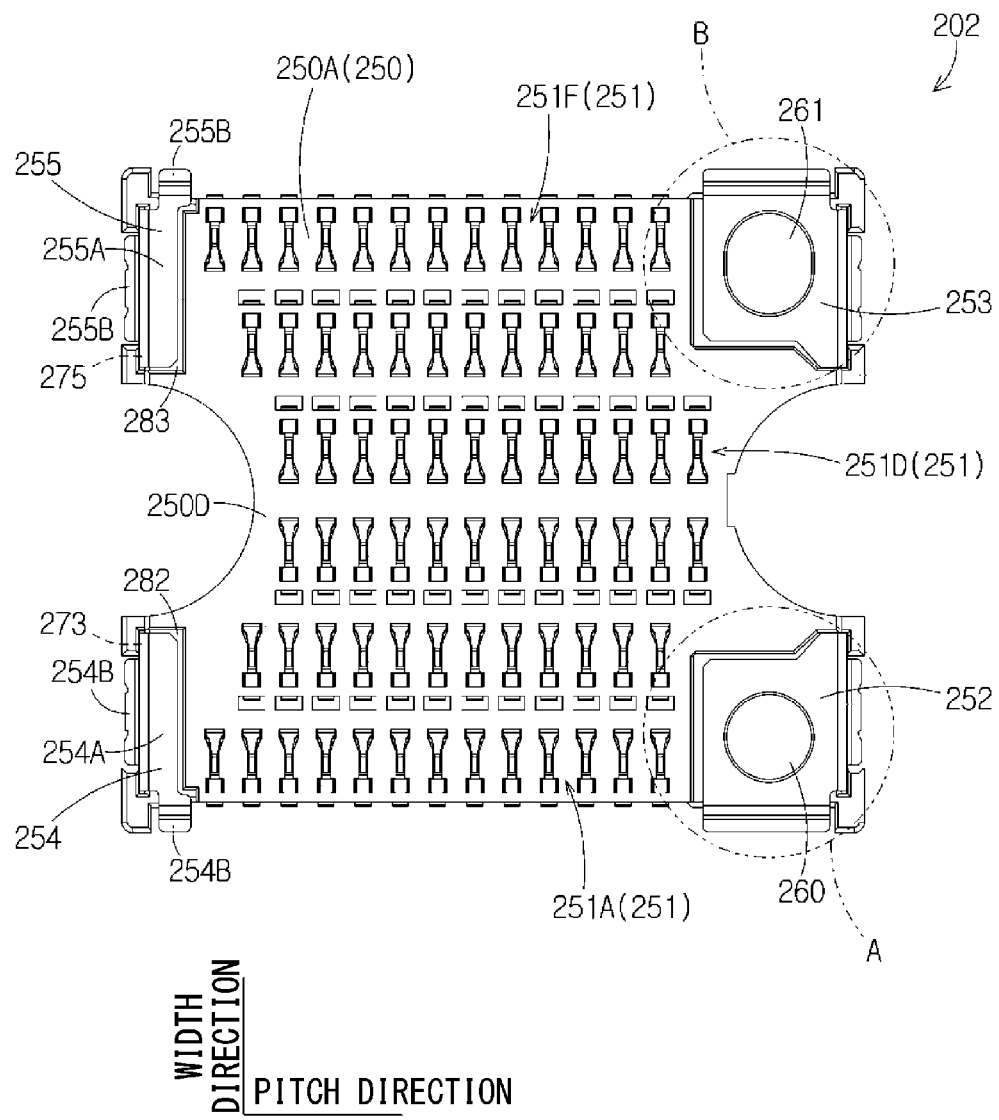
FIG. 7 is a plan view of the connector (first embodiment)
Figure 8:
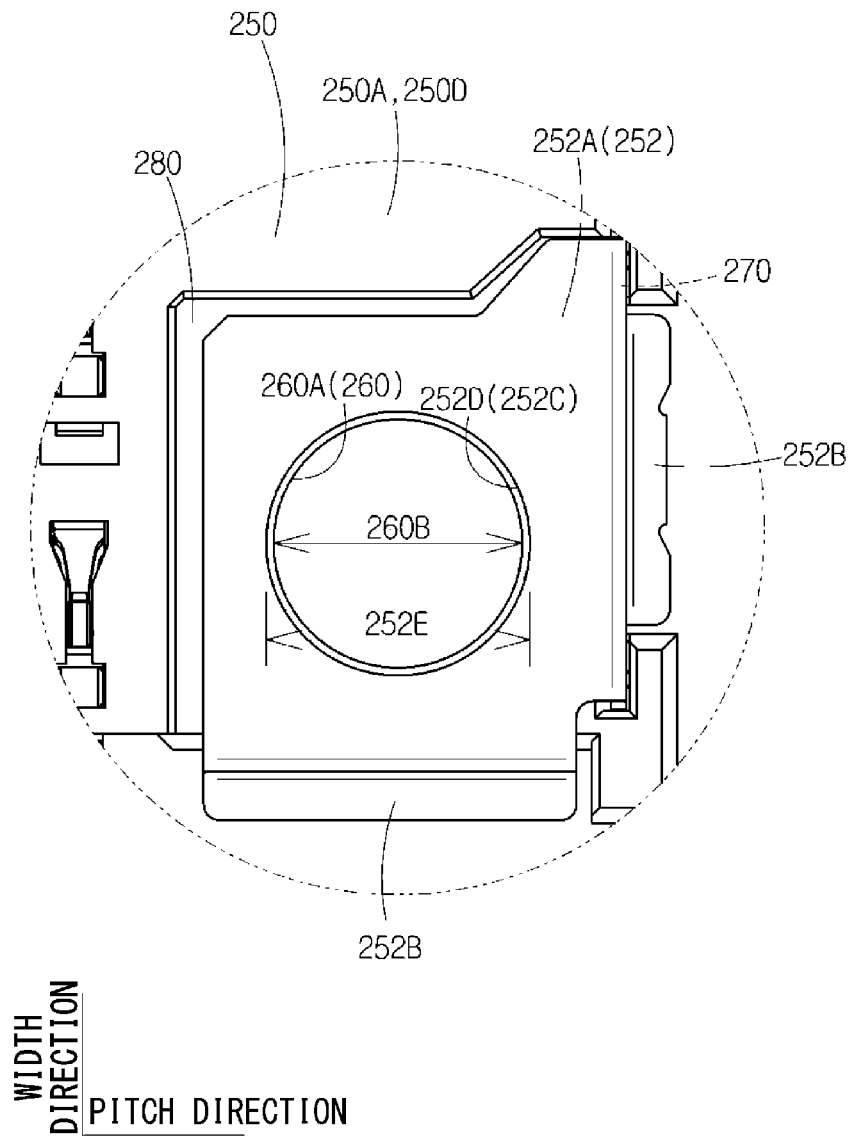
FIG. 8 is an enlarged view of a part A in FIG. 7 (first embodiment)
Figure 9:
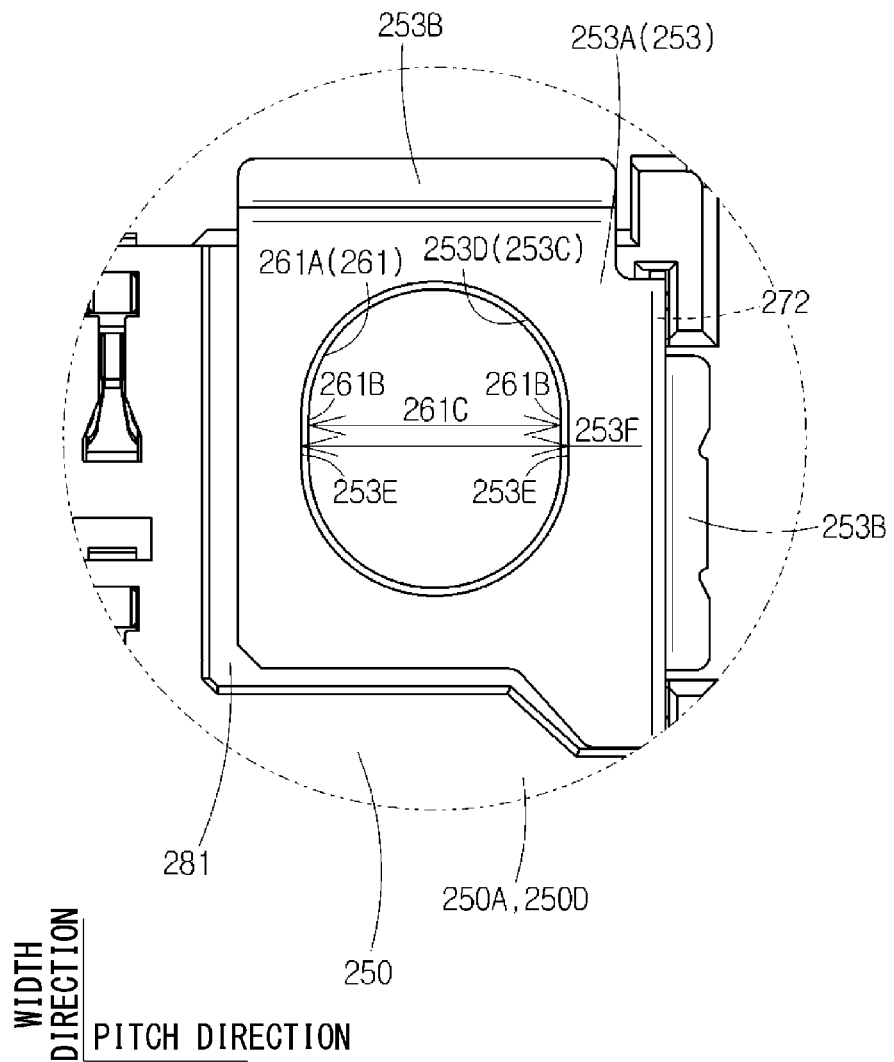
FIG. 9 is an enlarged view of a part B in FIG. 7 (first embodiment)

Further, as shown in FIGS. 7 and 8, the connector 202 further includes the first hold-down 252 (reinforcing member) made of metal. The housing 250 includes the CPU board opposed surface 250A (second board opposed surface) to be opposed to the CPU board 201. The first hold-down 252 includes the reinforcing plate part 252A that covers the CPU board opposed surface 250A around the first positioning hole 260. This structure allows the enlarging deformation of the first positioning hole 260 to be inhibited by the first hold-down 252, which prevents significant degradation of the positioning accuracy by the first positioning hole 260. The same applies to the second hold-down 253.

Further, as shown in FIG. 8, the first hold-down 252 is disposed in such a way that the reinforcing plate part 252A of the first hold-down 252 does not cover the inner edge 260A of the first positioning hole 260 when viewed from above. In this structure, the positioning function exerted by the first positioning hole 260 is not hindered by the first hold-down 252. The same applies to the second hold-down 253.

Further, as shown in FIG. 4, each contact row 251 includes the plurality of contacts 300. As shown in FIG. 12, each contact 300 includes the electrical contact spring piece 322 that projects upward from the CPU board opposed surface 250A. As shown in FIG. 5, the first hold-down accommodation recess 280 (accommodation recess) that accommodates the reinforcing plate part 252A of the first hold-down 252 is formed on the CPU board opposed surface 250A of the housing 250. In this structure, the reinforcing plate part 252A of the first hold-down 252 does not project upward beyond the CPU board opposed surface 250A, and therefore the downward elastic deformation of the electrical contact spring piece 322 is not hindered. The same applies to the second hold-down 253, the third hold-down 254, and the fourth hold-down 255.

Further, as shown in FIG. 8, the first hold-down 252 further includes the soldering part 252B that projects toward the input-output board 203 from the reinforcing plate part 252A of the first hold-down 252 and is connectable by soldering to the pad 215 of the input-output board 203. According to this structure, when the CPU board 201 is pressed against the connector 202 and thereby the housing 250 moves downward relative to the first hold-down 252, the first hold-down 252 receives the CPU board 201 and thereby restricts the further movement of the CPU board 201. The same applies to the second hold-down 253, the third hold-down 254, and the fourth hold-down 255.

Second Technical Idea, No. 0174

As shown in FIGS. 1 and 2, the connector 202 (board-to-board connector) is mounted on the input-output board 203 (first board). The connector 202 is interposed between the input-output board 203 and the CPU board 201 (second board), and thereby the plurality of pads 215 of the input-output board 203 and the plurality of pads 206 of the CPU board 201 are respectively electrically connected to one another. As shown in FIGS. 3 to 5, the connector 202 includes the flat-plate housing 250 made of insulating resin having the first positioning hole 209 and the second positioning hole 210, the plurality of contacts 300 held on the housing 250, and the first hold-down 252 and the second hold-down 253 made of metal disposed to correspond to the first positioning hole 260 and the second positioning hole 261, respectively. The housing 250 includes the CPU board opposed surface 250A (second board opposed surface) to be opposed to the CPU board 201. As shown in FIG. 8, the first hold-down 252 includes the reinforcing plate part 252A that covers the CPU board opposed surface 250A around the first positioning hole 260. Likewise, as shown in FIG. 9, the second hold-down 253 includes the reinforcing plate part 253A that covers the CPU board opposed surface 250A around the second positioning hole 261. This structure allows the enlarging deformation of the first positioning hole 260 to be inhibited by the first hold-down 252, which prevents significant degradation of the positioning accuracy by the first positioning hole 260. The same applies to the second hold-down 253. Further, as shown in FIG. 8, the first hold-down 252 is disposed in such a way that the reinforcing plate part 252A of the first hold-down 252 does not cover the inner edge 260A of the corresponding first positioning hole 260 when viewed from above. In this structure, the positioning function exerted by the first positioning hole 260 is not hindered by the first hold-down 252. The same applies to the second hold-down 253.

Further, as shown in FIG. 12, each contact 300 includes the electrical contact spring piece 322 that projects upward from the CPU board opposed surface 250A. As shown in FIG. 5, the first hold-down accommodation recess 280 (accommodation recess) that accommodates the reinforcing plate part 252A of the first hold-down 252 is formed on the CPU board opposed surface 250A of the housing 250. In this structure, the reinforcing plate part 252A of the first hold-down 252 does not project upward beyond the CPU board opposed surface 250A, and therefore the downward elastic deformation of the electrical contact spring piece 322 is not hindered. The same applies to the second hold-down 253.

Further, as shown in FIG. 8, the first positioning hole 260 is a round hole. The reinforcing plate part 252A of the first hold-down 252 has the penetrating hole 252C (round hole) that is larger than the first positioning hole 260. The first hold-down 252 is disposed in such a way that the inner edge 260A of the first positioning hole 260 is located radially inward with respect to the inner edge 252D of the penetrating hole 252C of the reinforcing plate part 252A of the first hold-down 252 when viewed from above. According to this structure, the structure where the reinforcing plate part 252A of the first hold-down 252 does not cover the inner edge 260A of the corresponding first positioning hole 260 is achieved in a rational way.

Further, as shown in FIG. 9, the second positioning hole 261 has the inner edge 261A including the two straight edge parts 261B that are parallel to each other. The reinforcing plate part 253A of the second hold-down 253 has the penetrating hole 253C (hole) having the inner edge 253D including the two straight edge parts 253E that are parallel to each other. The distance 253F between the two straight edge parts 253E of the reinforcing plate part 253A of the second hold-down 253 is longer than the distance 261C between the two straight edge parts 261B of the second positioning hole 261. The second hold-down 253 is disposed in such a way that the two straight edge parts 261B of the second positioning hole 261 are located between the two straight edge parts 253E of the reinforcing plate part 253A of the second hold-down 253 when viewed from above. According to this structure, the structure where the reinforcing plate part 253A of the second hold-down 253 does not cover the inner edge 261A of the corresponding second positioning hole 261 is achieved in a rational way.

Further, as shown in FIG. 8, the first hold-down 252 further includes the soldering part 252B that projects toward the input-output board 203 from the reinforcing plate part 252A of the first hold-down 252 and is connectable by soldering to the pad 215 of the input-output board 203. According to this structure, when the CPU board 201 is pressed against the connector 202 and thereby the housing 250 moves downward relative to the first hold-down 252, the first hold-down 252 receives the CPU board 201 and thereby restricts the further movement of the CPU board 201. The same applies to the second hold-down 253.

Third Technical Idea, No. 0167

As shown in FIGS. 1, 2 and 14, the connector 202A with a suction cover includes the connector 202 (board-to-board connector) and the suction cover 340 that is detachable from the connector 202. The connector 202 is mounted on the input-output board 203 (first board). The connector 202 is interposed between the input-output board 203 and the CPU board 201 (second board), and thereby the plurality of pads 215 of the input-output board 203 and the plurality of pads 206 of the CPU board 201 are respectively electrically connected. As shown in FIGS. 3 to 5, the connector 202 includes the housing 250 made of insulating resin, the plurality of contacts 300 held by the housing 250, and the first hold-down 252 made of metal. The housing 250 includes the CPU board opposed surface 250A (second board opposed surface) to be opposed to the CPU board 201. As shown in FIG. 8, the first hold-down 252 includes the reinforcing plate part 252A that covers the CPU board opposed surface 250A. As shown in FIG. 12, each contact 300 includes the electrical contact spring piece 322 that projects from the CPU board opposed surface 250A. As shown in FIGS. 14 and 15, the suction cover 340 includes the flat-plate suction plate part 341 that covers the electrical contact spring piece 322 of each contact 300 and can be sucked by a suction nozzle, the plurality of attachment spring pieces 342 that can catch on the connector 202 so that the suction plate part 341 is detachable from the connector 202, and the first main deformation restraining part 350 (first deformation restraining part) that projects from the suction plate part 341 toward the CPU board opposed surface 250A in order to inhibit the suction plate part 341 from being deformed toward the CPU board opposed surface 250A in the state where the suction cover 340 is attached to the connector 202. The first main deformation restraining part 350 is disposed to come into contact with the reinforcing plate part 252A when the suction plate part 341 is deformed toward the CPU board opposed surface 250A. This structure prevents the housing 250 from being broken by the first main deformation restraining part 350 of the suction cover 340. The same applies to the second main deformation restraining part 351, the third main deformation restraining part 352, and the fourth main deformation restraining part 353.

Further, as shown in FIG. 15, the first main deformation restraining part 350 is opposed to the reinforcing plate part 252A in the vertical direction in the state where the suction cover 340 is attached to the connector 202. This structure effectively prevents the housing 250 from being broken by the first main deformation restraining part 350 of the suction cover 340.

Further, as shown in FIG. 14, the suction cover 340 further includes the two removal hooks 344. The two removal hooks 344 project outward beyond the outer edge 354 of the connector 202 in the state where the suction cover 340 is attached to the connector 202. This structure allows fingers to easily catch on the removal hooks 344, which facilitates the removal of the suction cover 340 from the connector 202. Note that one of the two removal hooks 344 may be omitted.

Fourth Technical Idea, No. 0166

As shown in FIGS. 1 and 2, the connector 202 is mounted on the input-output board 203 (first board). The connector 202 includes the flat-plate housing 250 made of insulating resin and the contact 300 held on the housing 250 by press-fitting. As shown in FIG. 12, the housing 250 includes the press-fitting space 301 and the solder connection checking hole 302. The contact 300 includes the press-fit part 320 to be press-fit into the press-fitting space 301, and the soldering part 321 that extends from the press-fit part 320 and is connected by soldering to the pad 215 of the input-output board 203. The solder connection checking hole 302 is formed to penetrate the housing 250 in the vertical direction and allow the solder fillet 330, which is formed when the soldering part 321 is soldered to the pad 215 of the input-output board 203, to be checked through the solder connection checking hole 302. The housing 250 includes the separating wall 303 that separates the press-fitting space 301 from the solder connection checking hole 302. In this structure, the presence of the separating wall 303 prevents shavings of the housing 250 that can be generated when press-fitting the press-fit part 320 into the press-fitting space 301 from moving into the solder connection checking hole 302. This enables checking the solder fillet 330 from above through the solder connection checking hole 302 with no problem.

Further, as shown in FIG. 12, the press-fit part 320 is configured to bite into the pitch partition surface 304 (surface) that is the inner surface of the press-fitting space 301 and different from the first separating surface 306 (surface) constituting the separating wall 303. In this structure, no load is placed on the separating wall 303 when press-fitting the press-fit part 320 into the press-fitting space 301. This eases restrictions in terms of strength design of the separating wall 303.

Further, as shown in FIG. 12, the curve part 321B of the soldering part 321 is located inside the solder connection checking hole 302. This structure allows the boundary between the solder fillet 330 and the contact 300 to be checked through the solder connection checking hole 302 and thereby achieves more accurate determination as to whether the solder connection in the soldering part 321 is successfully made or not.

Note that, in FIG. 12, the continuity between the contact 300 and the pad 215 may be checked by inserting a probe needle into the solder connection checking hole 302 and making the probe needle come into contact with the curve part 321B of the soldering part 321, and further making another probe needle come into contact with a circuit pattern of the input-output board 203, which is electrically continuous with the pad 215. In this case also, the movement of shavings of the housing 250 that can be generated when press-fitting the press-fit part 320 into the press-fitting space 301 into the solder connection checking hole 302 is inhibited as described above, which allows the probe needle to easily come into contact with the curve part 321B of the soldering part 321.

Second Embodiment

A second embodiment is described hereinafter with reference to FIG. 16. Hereinafter, differences of this embodiment from the above-described first embodiment are mainly described, and redundant description is omitted.

Figure 16:
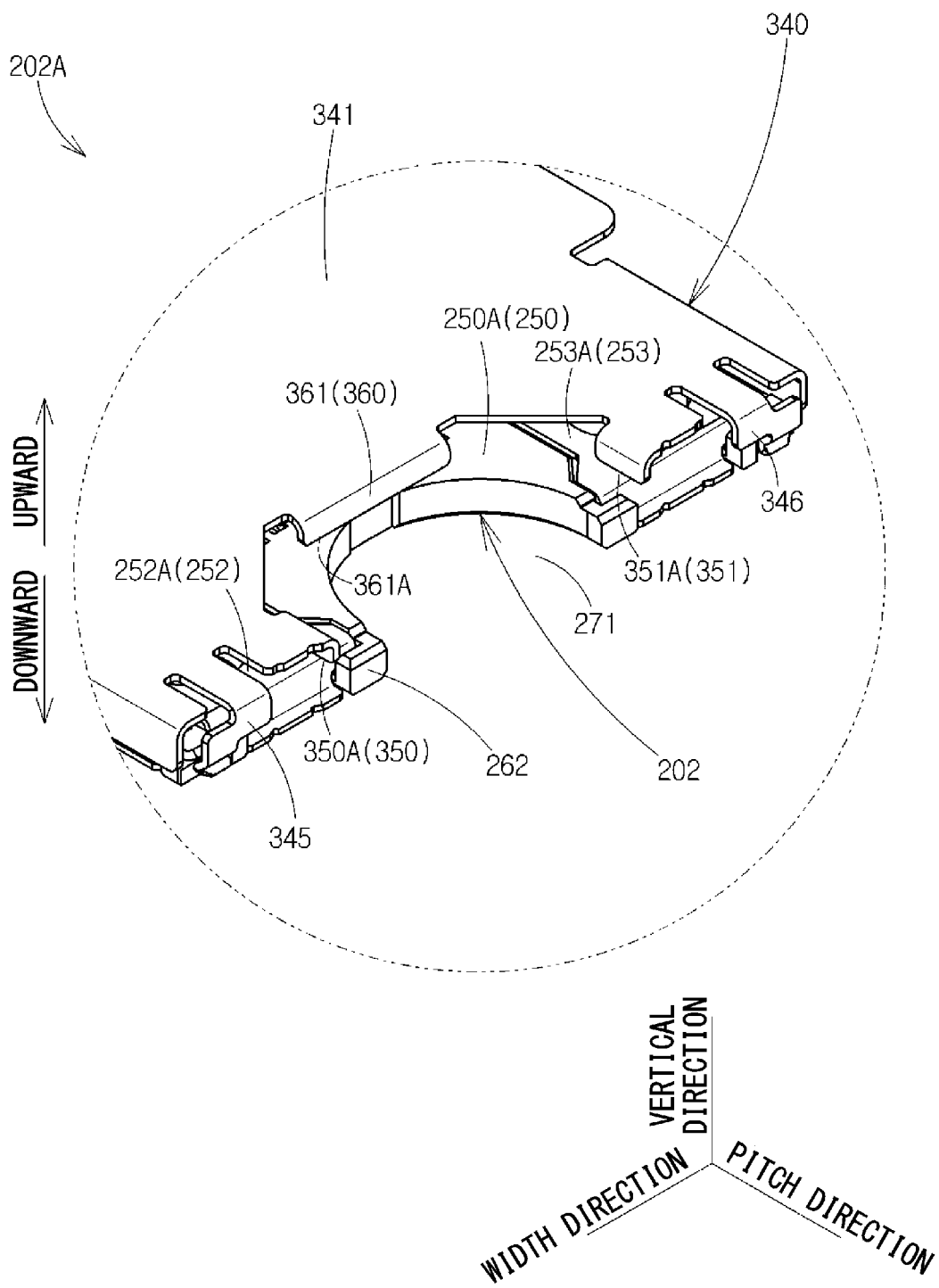
FIG. 16 is a partial perspective view of a connector with a suction cover (second embodiment)

As shown in FIG. 16, the suction cover 340 according to this embodiment further includes two sub deformation restraining parts 360 (second deformation restraining parts). The two sub deformation restraining parts 360 are respectively formed at both ends of the suction plate part 341 in the pitch direction. Specifically, the two sub deformation restraining parts 360 include a first sub deformation restraining part 361 disposed on the first pitch side surface 262 side and a second sub deformation restraining part, which is not shown, disposed on the second pitch side surface 263 side.

The first sub deformation restraining part 361 projects from the suction plate part 341 toward the CPU board opposed surface 250A in order to inhibit the suction plate part 341 from being deformed toward the CPU board opposed surface 250A in the state where the suction cover 340 is attached to the connector 202.

The first sub deformation restraining part 361 is disposed between the first main deformation restraining part 350 and the second main deformation restraining part 351. The first sub deformation restraining part 361 is disposed to avoid the first nut notch 271 when viewed from above. The first sub deformation restraining part 361 is formed by bending a part of the suction plate part 341 downward. In other words, the first sub deformation restraining part 361 is formed to project downward from the suction plate part 341. The first sub deformation restraining part 361 is disposed in such a way that a lower end 361A of the first sub deformation restraining part 361 is opposed to the CPU board opposed surface 250A in the vertical direction in the state where the suction cover 340 is attached to the connector 202.

Thus, when the suction plate part 341 is deformed toward the CPU board opposed surface 250A, the first main deformation restraining part 350 and the second main deformation restraining part 351 come into contact with the first hold-down 252 and the second hold-down 253, respectively, and further the first sub deformation restraining part 361 comes into contact with the CPU board opposed surface 250A of the housing 250, and therefore further deformation of the suction plate part 341 is inhibited. This prevents that the suction plate part 341 comes into contact with the plurality of contacts 300 to cause the plurality of contacts 300 to be broken.

Note that, in the state where the suction cover 340 is attached to the connector 202, the gap between the first main deformation restraining part 350 and the reinforcing plate part 252A in the vertical direction is smaller than the gap between the first sub deformation restraining part 361 and the CPU board opposed surface 250A in the vertical direction. Thus, when the suction plate part 341 is deformed toward the CPU board opposed surface 250A, the first main deformation restraining part 350 comes into contact with the first hold-down 252 before the first sub deformation restraining part 361 comes into contact with the CPU board opposed surface 250A of the housing 250. Thus, when the amount of deformation when the suction plate part 341 is deformed toward the CPU board opposed surface 250A is small, the first sub deformation restraining part 361 does not come into contact with the CPU board opposed surface 250A, which inhibits the generation of shavings. On the other hand, when the amount of deformation when the suction plate part 341 is deformed toward the CPU board opposed surface 250A is large, the first sub deformation restraining part 361 comes into contact with the CPU board opposed surface 250A of the housing 250 in addition to that the first main deformation restraining part 350 comes into contact with the first hold-down 252, which reliably inhibits further deformation of the suction plate part 341 and prevents that the suction plate part 341 comes into contact with the plurality of contacts 300 to cause the plurality of contacts 300 to be broken.

The same applies to the second sub deformation restraining part, which is not shown, disposed on the second pitch side surface 263 side. Further, any one of the two sub deformation restraining parts 360 may be omitted.

Third Embodiment

A third embodiment is described hereinafter with reference to FIG. 17. Hereinafter, differences of this embodiment from the above-described first embodiment are mainly described, and redundant description is omitted.

Figure 17:
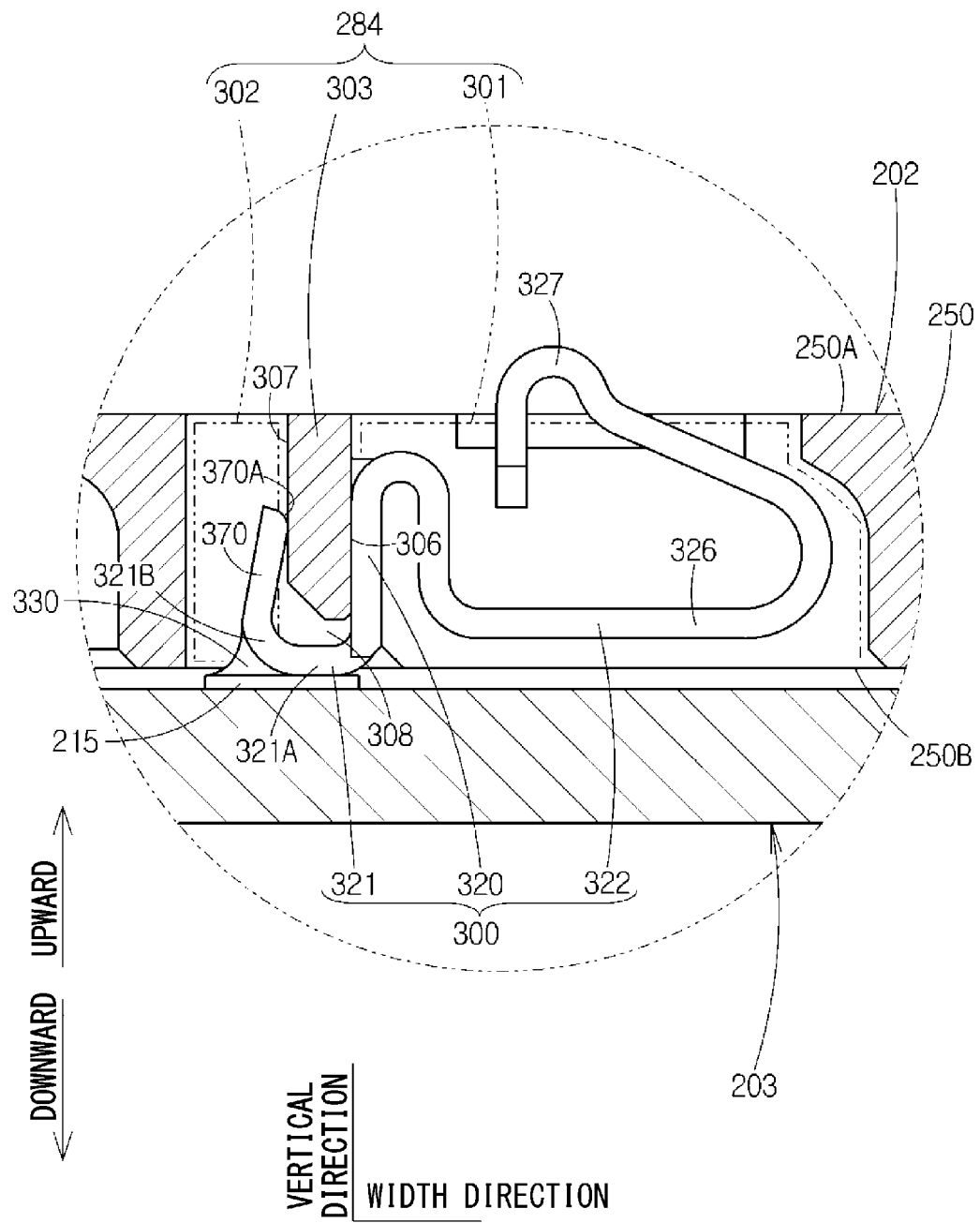
FIG. 17 is a partial cross-sectional view of a housing to which a contact is attached (third embodiment)

As shown in FIG. 17, the contact 300 further includes a support spring piece 370 that is disposed inside the solder connection checking hole 302 and elastically comes into contact with the second separating surface 307 of the separating wall 303. The support spring piece 370 is elastically in contact with the second separating surface 307 of the separating wall 303 by the elastic restoring force of the contact 300. The effect of stabilizing the posture of each contact 300 in each contact accommodation part 284 is thereby obtained.

The support spring piece 370 is disposed to project upward from the curve part 321B of the soldering part 321. The support spring piece 370 is inclined so as to approach the separating wall 303 as it goes upward from the curve part 321B of the soldering part 321.

The press-fit part 320 is in contact with the first separating surface 306 of the separating wall 303. The support spring piece 370 is elastically in contact with the second separating surface 307 of the separating wall 303 so as to press the second separating surface 307 of the separating wall 303 toward the press-fit part 320. The press-fit part 320 and the support spring piece 370 thereby elastically put the separating wall 303 between them, and therefore the posture of each contact 300 is further stabilized in each contact accommodation part 284.

When press-fitting the press-fit part 320 into the press-fitting space 301, the support spring piece 370 moves upward, remaining in contact with the second separating surface 307 of the separating wall 303. Thus, in this embodiment, the support spring piece 370 includes a curved surface 370A that is convex toward the press-fit part 320. The curved surface 370A is elastically in contact with the second separating surface 307 of the separating wall 303. In this structure, even if the support spring piece 370 moves upward, remaining in contact with the second separating surface 307 of the separating wall 303 when press-fitting the press-fit part 320 into the press-fitting space 301, the second separating surface 307 is less likely to be shaved by the support spring piece 370, which inhibits shavings of the separating wall 303 from being generated in the solder connection checking hole 302.

Fourth Embodiment

A fourth embodiment is described hereinafter with reference to FIG. 18. Hereinafter, differences of this embodiment from the above-described first embodiment are mainly described, and redundant description is omitted.

In the above-described first embodiment, the first nut notch 271 for avoiding the physical interference between the first nut 231 and the housing 250 is formed on the housing 250 as shown in FIGS. 1 and 5. Likewise, the second nut notch 274 for avoiding the physical interference between the second nut 232 and the housing 250 is formed on the housing 250.

Figure 18:
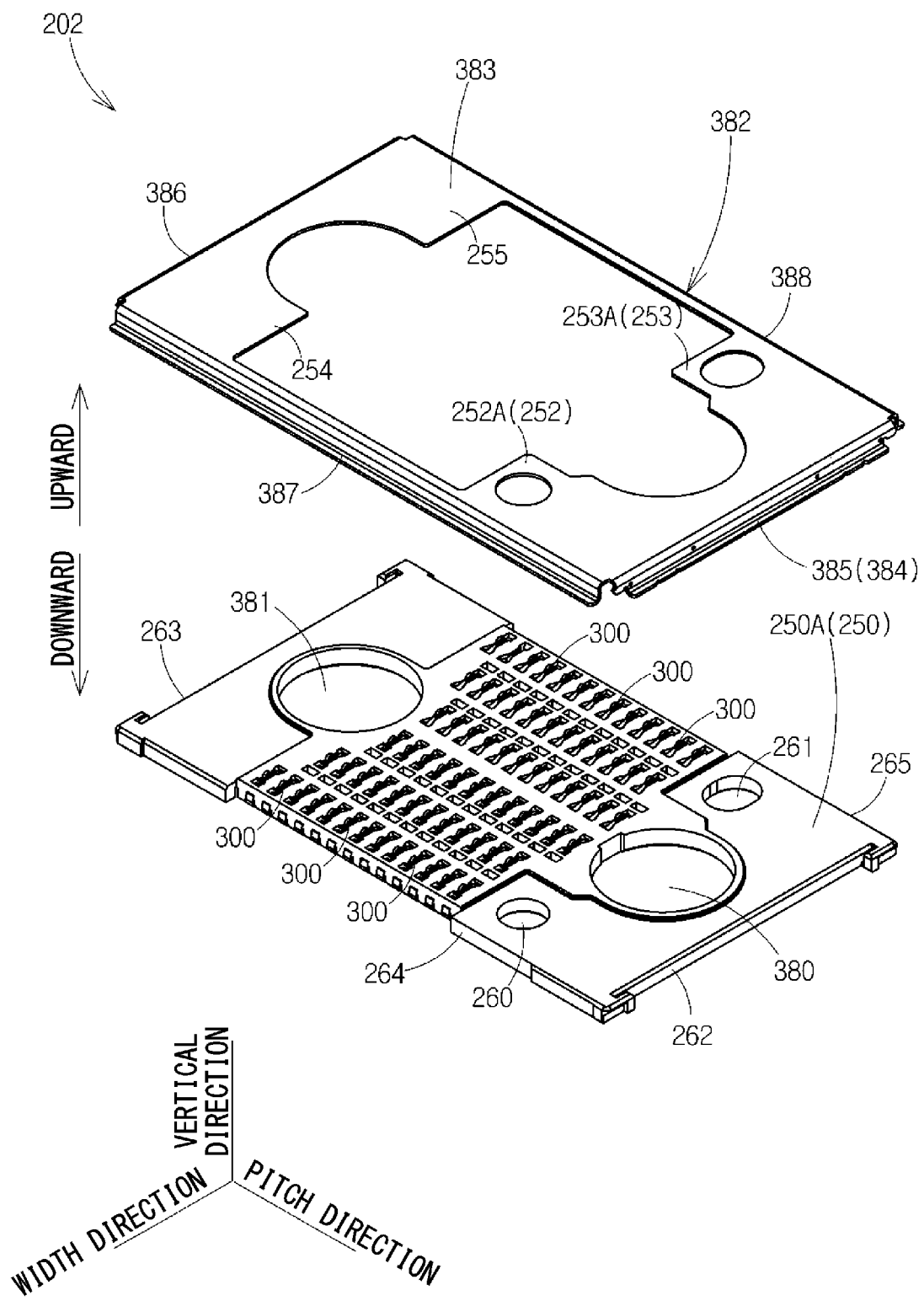
FIG. 18 is an exploded perspective view of a connector (fourth embodiment)

On the other hand, in this embodiment, as shown in FIG. 18, a first nut penetrating hole 380 for avoiding the physical interference between the first nut 231 and the housing 250 is formed on the housing 250, instead of the above-described first nut notch 271. Likewise, a second nut penetrating hole 381 for avoiding the physical interference between the second nut 232 and the housing 250 is formed on the housing 250, instead of the above-described second nut notch 274.

Further, in the above-described first embodiment, as shown in FIG. 4, the connector 202 includes the first hold-down 252, the second hold-down 253, the third hold-down 254, and the fourth hold-down 255. The first hold-down 252, the second hold-down 253, the third hold-down 254, and the fourth hold-down 255 are separate parts.

On the other hand, in this embodiment, as shown in FIG. 18, the first hold-down 252, the second hold-down 253, the third hold-down 254, and the fourth hold-down 255 are formed integrally so that they are continuous with one another. In this manner, by forming the first hold-down 252, the second hold-down 253, the third hold-down 254, and the fourth hold-down 255 as one part, high electromagnetic shield effect is obtained.

To be specific, the connector 202 includes an entire hold-down 382. The entire hold-down 382 includes the first hold-down 252, the second hold-down 253, the third hold-down 254, and the fourth hold-down 255. The entire hold-down 382 is formed annularly so as to surround the plurality of contacts 300 when viewed from above. The entire hold-down 382 includes a reinforcing plate part 383 and a plurality of soldering parts 384.

The reinforcing plate part 383 is a part that covers the CPU board opposed surface 250A of the housing 250. The reinforcing plate part 383 includes the reinforcing plate part 252A of the first hold-down 252 and the reinforcing plate part 253A of the first hold-down 253, for example.

The plurality of soldering parts 384 are connectable by soldering to the corresponding pads of the input-output board 203. The plurality of soldering parts 384 include a first soldering part 385, a second soldering part 386, a third soldering part 387, and a fourth soldering part 388.

The first soldering part 385 corresponds to the first pitch side surface 262 of the housing 250.

The second soldering part 386 corresponds to the second pitch side surface 263 of the housing 250.

The third soldering part 387 corresponds to the first width side surface 264 of the housing 250.

The fourth soldering part 388 corresponds to the second width side surface 265 of the housing 250.

Fifth Embodiment

Figure 19:
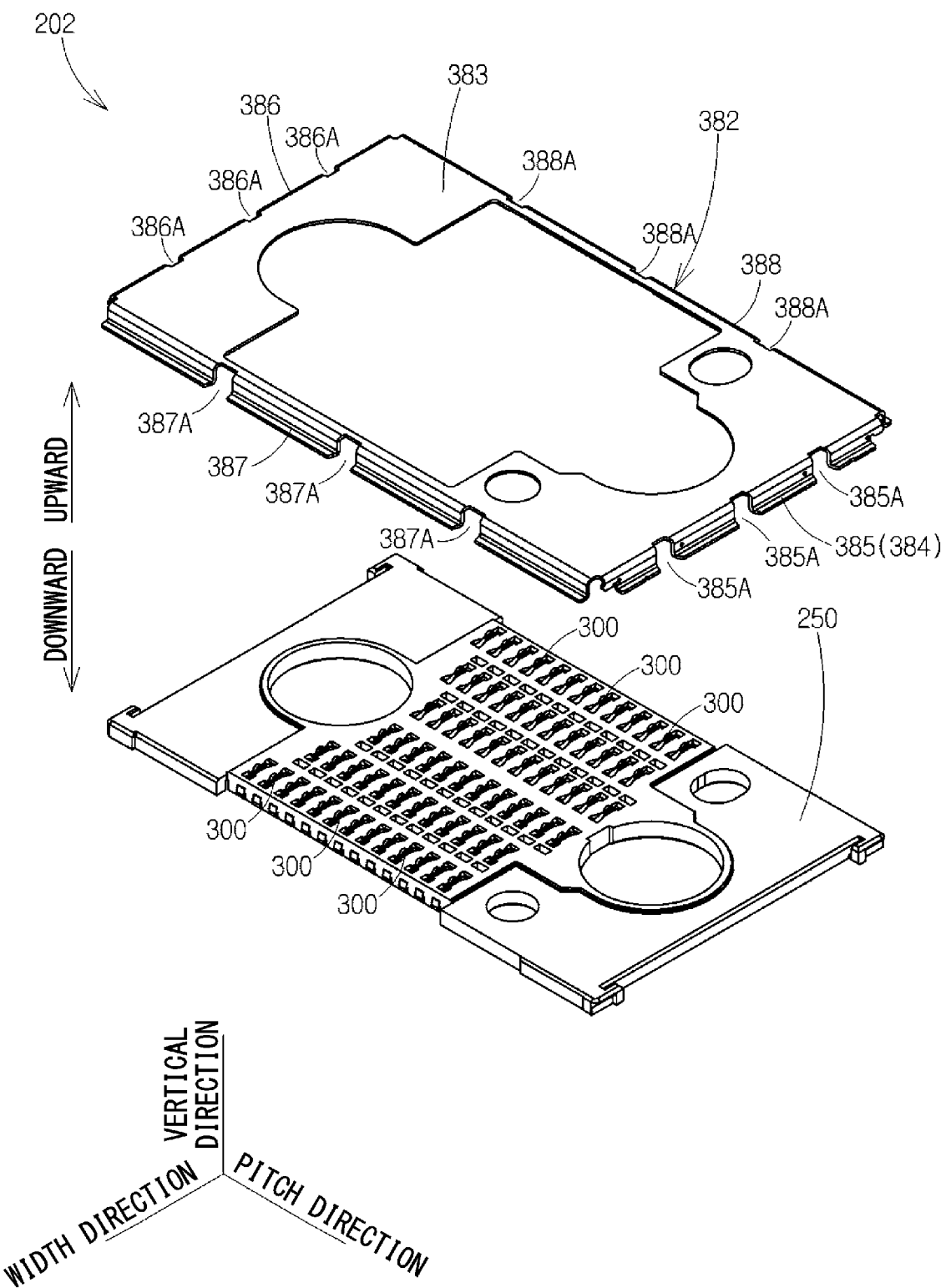
FIG. 19 is an exploded perspective view of a connector (fifth embodiment)
Figure 20:
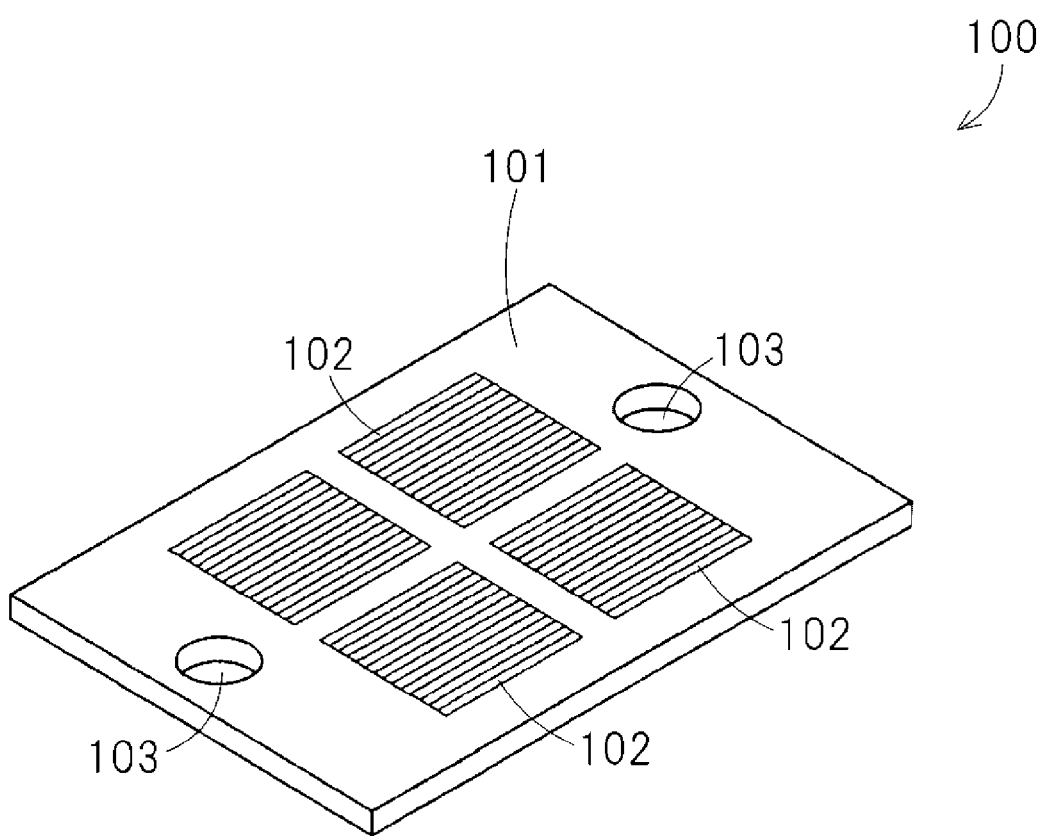
FIG. 20 is a view showing a simplified version of FIG. 2 of Japanese Unexamined Patent Application Publication No. 2010-182551.

A fifth embodiment is described hereinafter with reference to FIG. 19. Hereinafter, differences of this embodiment from the above-described fourth embodiment are mainly described, and redundant description is omitted.

The first soldering part 385 according this embodiment is provided with a plurality of slits 385A that divide the first soldering part 385 in the width direction.

Likewise, the second soldering part 386 according this embodiment is provided with a plurality of slits 386A that divide the second soldering part 386 in the width direction.

Likewise, the third soldering part 387 according this embodiment is provided with a plurality of slits 387A that divide the third soldering part 387 in the width direction.

Likewise, the fourth soldering part 388 according this embodiment is provided with a plurality of slits 388A that divide the fourth soldering part 388 in the width direction.

Forming a plurality of slits that divide each of the soldering parts 384 in the longitudinal direction of each soldering part 384 as described above enables the absorption of the warpage of the input-output board 203, for example, and contributes to weight reduction of the connector 202.

The above-described embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A board-to-board connector to be mounted on a first board and interposed between the first board and a second board to electrically connect a plurality of pads of the first board with a plurality of pads of the second board respectively, comprising:
    a rectangular flat-plate housing including a first positioning hole and a second positioning hole; and
    a first contact row and a second contact row held on the housing, wherein
    the housing includes only the first positioning hole and the second positioning hole as positioning holes for positioning the second board with respect to the board-to-board connector,
    the first contact row and the second contact row are disposed to separate from each other in a direction orthogonal to a longitudinal direction of the first contact row, the housing includes a first side surface on one side thereof and a second side surface on another side thereof opposite to the one side,
    the first contact row and the second contact row extend from the first side surface to the second side surface,
    the first positioning hole is disposed between the first side surface and the first contact row,
    the second positioning hole is disposed between the first side surface and the second contact row,
    a third contact row disposed between the first contact row and the second contact row and extending from the first side surface to the second side surface, and
    a distance D1 between the first contact row and the first side surface, a distance D2 between the second contact row and the first side surface, and a distance D3 between the third contact row and the first side surface satisfy relationships of D3<D1 and D3<D2.

2. The board-to-board connector according to claim 1, wherein a notch open to the first side surface or a hole is formed between the first positioning hole and the second positioning hole.

3. The board-to-board connector according to claim 1, wherein a distance E1 between the first contact row and the second side surface, a distance E2 between the second contact row and the second side surface, and a distance $E3$ between the third contact row and the second side surface satisfy relationships of $E3>E1$ and $E3>E2$.

* * * * *